(12) United States Patent
Izawa et al.

(10) Patent No.: US 9,181,476 B2
(45) Date of Patent: Nov. 10, 2015

(54) GREEN-EMITTING PHOSPHOR PARTICLES, METHOD FOR MANUFACTURING GREEN-EMITTING PHOSPHOR PARTICLES, COLOR CONVERSION SHEET, LIGHT-EMITTING DEVICE, AND IMAGE DISPLAY DEVICE ASSEMBLY

(75) Inventors: Takamasa Izawa, Tochigi (JP); Tsuneo Kusunoki, Kanagawa (JP); Takahiro Igarashi, Kanagawa (JP)

(73) Assignee: DEXERIALS CORPORATION, Tokyo (JP)

( * ) Notice: Subject to any disclaimer, the term of this patent is extended or adjusted under 35 U.S.C. 154(b) by 914 days.

(21) Appl. No.: 13/099,461

(22) Filed: May 3, 2011

(65) Prior Publication Data
US 2011/0273864 A1    Nov. 10, 2011

(30) Foreign Application Priority Data

May 10, 2010  (JP) .................................. 2010-108220

(51) Int. Cl.
*F21K 2/00*       (2006.01)
*C09K 11/77*      (2006.01)
*H01L 33/50*      (2010.01)

(52) U.S. Cl.
CPC ......... *C09K 11/7741* (2013.01); *C09K 11/7731* (2013.01); *H01L 33/502* (2013.01); *H01L 33/504* (2013.01); *H01L 33/505* (2013.01); *H01L 2224/45144* (2013.01); *H01L 2224/48091* (2013.01); *H01L 2224/48247* (2013.01); *H01L 2924/13091* (2013.01)

(58) Field of Classification Search
CPC .................................................. C09K 11/7731
USPC ..................... 252/301.4 S, 301.4 R
See application file for complete search history.

(56) References Cited

U.S. PATENT DOCUMENTS 6,153,123 A    11/2000   Hampden-Smith et al.

FOREIGN PATENT DOCUMENTS

JP           2008-041706 A    2/2008

OTHER PUBLICATIONS

Benalloul et al., IIA-III2-S4 ternary compounds: new host matrices for full color thin film electroluminescence displays. Appl. Phys. Lett. 1993; 63(14): 1954-1956.
Jabbarov et al., Radiative properties of Eu2+ in BaGa2S4. J of Physics and Chem of Solids. 2005; 66:1049-1056.
Linder et al., Simulation of LEDs with Phosphorescent Media for the Generation of White Light. Joachim Piprek: Nitride semiconductor devices: principles and simulation. Wiley-VHC Verlag GmbH & Co. 2007; 327-351.
Marsh et al., A method for the clean syntheses of sulfides/selenides. J of the Electrochem Soc. 2001; 148(7): D89-D93.
Sastry et al., Preparation of green-emitting Sr1-xEuxGa2S4 phosphors by a solid-state rapid metathesis reaction. Journal of the Electrochemical Society. 1999; 146(11):4316-4319.
Zhang et al., Luminescent properties of SrGa2S4:Eu and its application in green LEDs. J of Rare Earths. 2007; 25: 701-705.

*Primary Examiner* — Carol M Koslow
(74) *Attorney, Agent, or Firm* — Oliff PLC

(57) ABSTRACT

A method for manufacturing green-emitting phosphor particles including the steps of producing a powder containing europium and strontium from a solution containing a europium compound and a strontium compound, mixing the resulting powder and a powdered gallium compound, and performing firing.

8 Claims, 13 Drawing Sheets

10.0 μm 10.0 μm

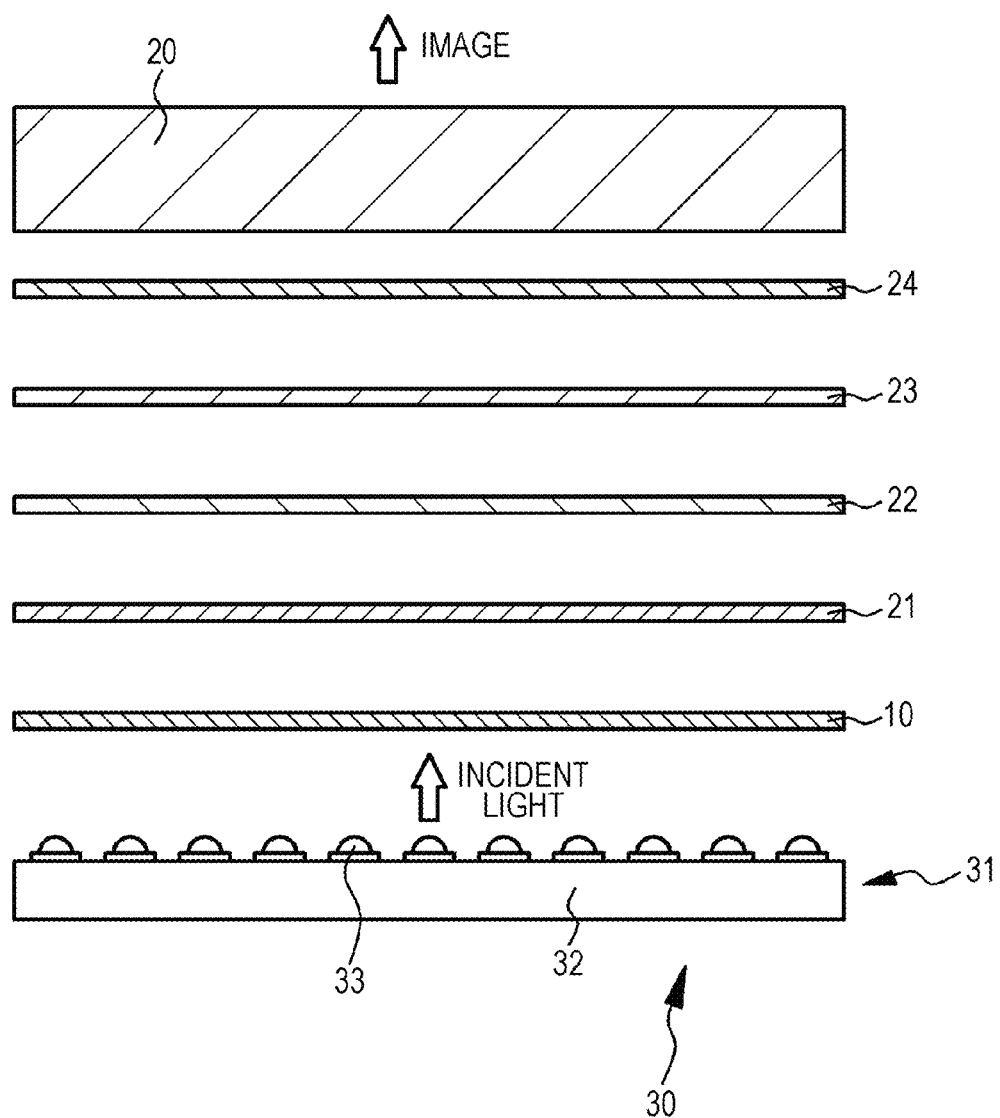

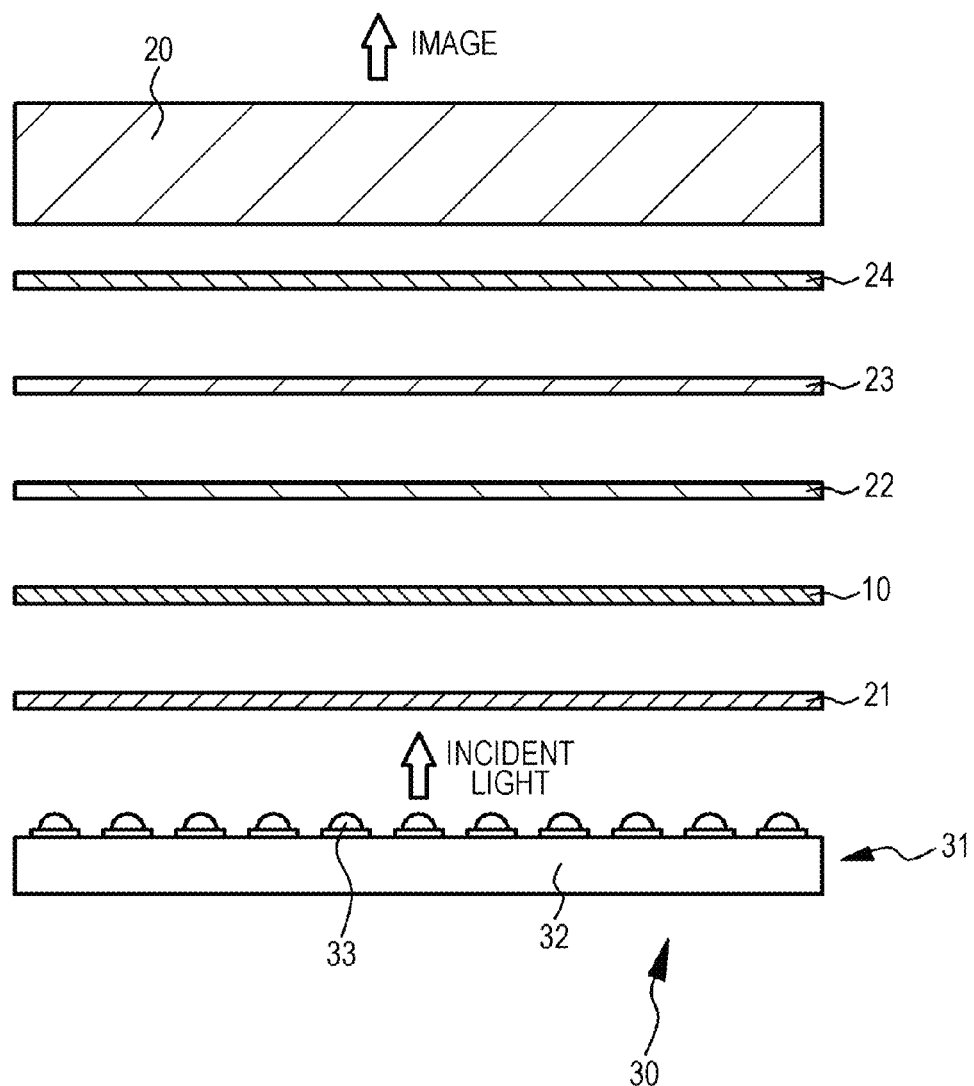

US 9,181,476 B2

GREEN-EMITTING PHOSPHOR PARTICLES, METHOD FOR MANUFACTURING GREEN-EMITTING PHOSPHOR PARTICLES, COLOR CONVERSION SHEET, LIGHT-EMITTING DEVICE, AND IMAGE DISPLAY DEVICE ASSEMBLY

BACKGROUND OF THE INVENTION

1. Field of the Invention

The present invention relates to green-emitting phosphor particles, a method for manufacturing the green-emitting phosphor particles, a color conversion sheet, a light-emitting device, and an image display device assembly.

2. Description of the Related Art

As for a phosphor material for a white-emitting diode (LED), a $SrGa_2S_4$:Eu phosphor has been common knowledge. In order to amplify the brightness of the $SrGa_2S_4$:Eu phosphor, it is necessary to increase absorption of excitation light through doping with europium (Eu) serving as an emission center at a high concentration. Doping with excessive europium increases the amount of absorption of excitation light, but a problem occurs in that an internal quantum efficiency is reduced due to saturation of concentration of the emission center and, conversely, the brightness is reduced. In general, this is referred to as concentration quenching. Therefore, in the doping with europium, there is an optimum value for the concentration.

SUMMARY OF THE INVENTION

U.S. Pat. No. 6,153,123 discloses an invention related to $M^1(M^2, Ga)_2S_4$, specifically, phosphor particles composed of $(Sr,Ca)Ga_2S_4$, and it is mentioned that the atomic percentage of an activator is specified to be 0.02% to 15%. However, if the atomic percentage of the activator is specified to be, for example, 10% to 15%, concentration quenching occurs and the brightness is reduced. Such a problem has not yet been solved.

It is desirable to provide green-emitting phosphor particles, wherein the internal quantum efficiency is not easily reduced even in the case where doping with excessive europium is effected, and a method for manufacturing the green-emitting phosphor particles, as well as a color conversion sheet, a light-emitting device, and an image display device assembly by using the green-emitting phosphor particles.

A method for manufacturing green-emitting phosphor particles, according to an embodiment of the present invention, includes the steps of producing a powder containing europium and strontium from a solution containing a europium compound and a strontium compound, mixing the resulting powder and a powdered gallium compound, and performing firing.

A method for manufacturing green-emitting phosphor particles, according to another embodiment of the present invention, includes the steps of producing a powder by adding a powdered gallium compound to a solution containing a europium compound and a strontium compound and adding a salt to precipitate the europium compound and the strontium compound and firing the resulting powder.

A color conversion sheet, according to another embodiment of the present invention, includes a first transparent base member, a second transparent base member, and a color conversion layer sandwiched between the first transparent base member and the second transparent base member, wherein the color conversion layer is formed from at least green-emitting phosphor particles, the green-emitting phosphor particles are composed of $(Sr,Ba,Ca)_{1-x}Ga_2S_4$:$Eu_x$ (where $0.10 \leq x \leq 0.20$, preferably $0.10 \leq x \leq 0.18$), and the value of (internal quantum efficiency/absorption efficiency) is 0.7 or more.

A light-emitting device according to another embodiment of the present invention includes (a) a light source and (b) phosphor particles which are excited by the light emitted from the light source, wherein the phosphor particles are composed of at least green-emitting phosphor particles, the green-emitting phosphor particles are composed of $(Sr,Ba,Ca)_{1-x}Ga_2S_4$:$Eu_x$ (where $0.10 \leq x \leq 0.20$, preferably $0.10 \leq x \leq 0.18$), and the value of (internal quantum efficiency/absorption efficiency) is 0.7 or more.

An image display device assembly according to another embodiment of the present invention includes (A) an image display device and (B) a light-emitting device to illuminate the image display device from the back, wherein the light-emitting device includes (a) a light source and (b) phosphor particles which are excited by the light emitted from the light source, the phosphor particles are composed of at least green-emitting phosphor particles, the green-emitting phosphor particles are composed of $(Sr,Ba,Ca)_{1-x}Ga_2S_4$:$Eu_x$ (where $0.10 \leq x \leq 0.20$, preferably $0.10 \leq x \leq 0.18$), and the value of (internal quantum efficiency/absorption efficiency) is 0.7 or more.

Green-emitting phosphor particles according to another embodiment of the present invention are composed of $(Sr,Ba,Ca)_{1-x}Ga_2S_4$:$Eu_x$ (where $0.10 \leq x \leq 0.20$, preferably $0.10 \leq x \leq 0.18$), wherein the value of (internal quantum efficiency/absorption efficiency) is 0.7 or more.

Regarding the method for manufacturing green-emitting phosphor particles according to an embodiment of the present invention, the powder (intermediate powder) containing europium and strontium is produced from the solution containing the europium compound and the strontium compound. Furthermore, regarding the method for manufacturing green-emitting phosphor particles according to another embodiment of the present invention, the powder is produced by adding the powdered gallium compound to the solution containing a europium compound and a strontium compound and adding the salt, specifically adding the salt to precipitate the europium compound and the strontium compound. As described above, in the methods for manufacturing green-emitting phosphor particles according to the embodiments of the present invention, a so-called wet method is adopted. Therefore, it is believed that Eu is dispersed uniformly, a region having a high Eu concentration is not present locally and, thereby, cross deactivation does not occur easily. Consequently, the green-emitting phosphor particles produced by the above-described methods for manufacturing green-emitting phosphor particles according to the embodiments of the present invention, the green-emitting phosphor particles according to the embodiment of the present invention, and the green-emitting phosphor particles regarding the color conversion sheet, the light-emitting device, and the image display device assembly according to the embodiments of the present invention, can maintain a high internal quantum efficiency even when the absorption efficiency increases.

BRIEF DESCRIPTION OF THE DRAWINGS

FIG. 7 is a conceptual diagram of an image display device assembly in Example 3;

FIG. 8 is a conceptual diagram of a modified example of the image display device assembly in Example 3;

DESCRIPTION OF THE PREFERRED EMBODIMENTS

Figure 1:
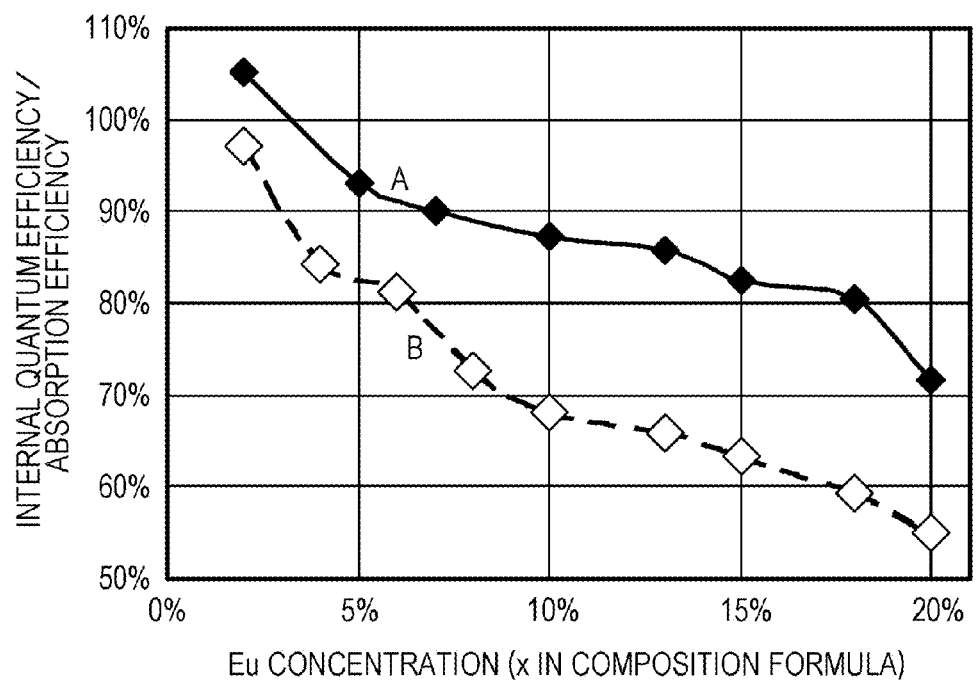
FIG. 1 is a graph showing the calculation results of (internal quantum efficiency/absorption efficiency) of green-emitting phosphor particles in Example 1 and Comparative example 1.

The present invention will be described below on the basis of the examples with reference to the drawings. However, the present invention is not limited to the examples, and various numerical values and materials in the examples are no more than exemplifications. In this regard, the explanations will be made in the following order.

1. General explanations of green-emitting phosphor particles according to an embodiment of the present invention, methods for manufacturing green-emitting phosphor particles according to embodiments of the present invention, color conversion sheet, light-emitting device, and image display device assembly 2. Example 1 (green-emitting phosphor particles according to an embodiment of the present invention and methods for manufacturing green-emitting phosphor particles according to embodiments of the present invention)

3. Example 2 (color conversion sheet according to an embodiment of the present invention)

4. Example 3 (light-emitting device and image display device assembly according to embodiments of the present invention)

5. Example 4 (modification of Example 3)

6. Example 5 (another modification of Example 3), others

General explanations of green-emitting phosphor particles according to an embodiment of the present invention, methods for manufacturing green-emitting phosphor particles according to embodiments of the present invention, color conversion sheet, light-emitting device, and image display device assembly Regarding the method for manufacturing green-emitting phosphor particles according to an embodiment of the present invention, a powder (intermediate powder) composed of (Sr, Eu)$SO_3$ is produced by dropping a sulfite into a solution containing a europium compound and a strontium compound, although not limited to this. Furthermore, regarding the method for manufacturing green-emitting phosphor particles according to another embodiment of the present invention, the above-described powder containing Sr, Eu, and Ga is produced by adding a powdered gallium compound to a solution containing a europium compound and a strontium compound and dropping a sulfite.

Moreover, in the method for manufacturing green-emitting phosphor particles according to an embodiment of the present invention including the above-described various preferable forms, the above-described powder (intermediate powder) and the powdered gallium compound may be mixed by using a ball mill, although not limited to this. The mixing conditions, e.g., a mixing time, may be determined appropriately by performing various tests.

In the methods for manufacturing green-emitting phosphor particles according to the embodiments of the present invention including the above-described preferable forms, firing may be performed in an hydrogen sulfide gas ($H_2S$) atmosphere, or be performed in a carbon sulfide ($CS_2$) atmosphere. The firing conditions, e.g., the firing temperature, the firing time, the temperature rising rate, and the temperature rising time, may be determined appropriately by performing various tests.

In addition, in the methods for manufacturing green-emitting phosphor particles according to the embodiments of the present invention including the above-described preferable forms, the green-emitting phosphor particles may be composed of $Sr_{1-x}Ga_2S_4:Eu_x$ (where $0.10 \leq x \leq 0.20$, preferably $0.10 \leq x \leq 0.18$), and the value of (internal quantum efficiency/absorption efficiency) may be 0.7 or more.

In the color conversion sheet according to an embodiment of the present invention, the color conversion layer may be formed from green-emitting phosphor particles and red-emitting particles. In that form, it is possible that blue light enters the color conversion sheet and white light is emitted from the color conversion sheet.

In the light-emitting device or the image display device assembly according to the embodiments of the present invention, the phosphor particles may be composed of green-emitting phosphor particles and red-emitting particles. In the light-emitting device or the image display device assembly according to the embodiments of the present invention including such a form, the layered phosphor particles may be disposed on a first surface of a transparent base member and a light source may be disposed opposing to a second surface opposite to the first surface of the transparent base member. In this case, the phosphor particles may be covered with the second transparent base member. The above-described configuration and structure may be substantially the same configuration and structure of the color conversion sheet according to an embodiment of the present invention.

However, the configuration and structure of the phosphor particles in the light-emitting device or the image display device assembly according to the embodiments of the present invention are not limited to this. Phosphor particles composed of the green-emitting phosphor particles or the green-emitting phosphor particles and red-emitting particles may be dispersed in the inside of the transparent base member. The above-described transparent base member may be formed by, for example, an extrusion molding method or calendering method in related art. Alternatively, a transparent base member provided with a green-emitting phosphor particle forming region and a red-emitting particle forming region may be disposed between the light source and the image display device. Here, the green-emitting phosphor particle forming region is disposed on the transparent base member in such a way as to be located between a green-emitting subpixel (subpixel G) and the light source in the image display device. The red-emitting particle forming region is disposed on the transparent base member in such a way as to be located between a red-emitting subpixel (subpixel R) and the light source in the image display device. The green-emitting phosphor particles and the red-emitting particles are not disposed between a blue-emitting subpixel (subpixel B) and the light source in the image display device. Alternatively, the light source may be covered with a cap-shaped member while layered phosphor particles (phosphor particle layer) may be disposed on the inside surface of the cap-shaped member. Alternatively, a material (sheet-shaped or film-shaped material) in which phosphor particles are dispersed in the inside of a transparent base member may be disposed on the inside surface of a cap-shaped member. The above-described sheet-shaped or film-shaped material may be formed by, for example, an extrusion molding method or a calendering method in related art. Alternatively, phosphor particles may be dispersed in the inside of a cap-shaped member. The above-described cap-shaped members may be formed by an injection molding method, an extrusion molding method, a transfer molding method, a calendering method, a flash molding method, a laminate molding method, a film formation molding method, a compression molding method, a firing method, a casting method, a blow molding method, an inflation molding method, a solution immersion molding method, a foam molding method, a reaction injection molding method, or the like in related art.

The light-emitting device may be formed from a planar light-emitting device (planar light source device). Examples of planar light-emitting devices include direct-lighting type planar light-emitting devices disclosed in Japanese Unexamined Utility Model Registration Application Publication No. 63-187120, Japanese Unexamined Patent Application Publication No. 2002-277870, and the like and edge-light type (may be referred to as side light type) planar light-emitting devices disclosed in Japanese Unexamined Patent Application Publication No. 2002-131552 and the like. The light-emitting device may be configured to include a light diffusion plate, a group of optically functional sheets (films), e.g., diffusion sheets, prism sheets (films), BEF and DBEF (these are trade names of Sumitomo 3M Limited), and polarization conversion sheets (films), and a reflection sheet. The group of optically functional sheets may be formed from various sheets disposed discretely or be formed through lamination and integration. The light diffusion plate and the group of optically functional sheets are disposed between the light-emitting device and the image display device. Examples of materials constituting the light diffusion plate include polycarbonate resins (PC), polystyrene based resins (PS), methacrylic resins, and cycloolefin resins, e.g., "ZEONOR" which is a norbornene based polymer resin and which is produced by ZEON Corporation.

In the case where the light-emitting device is formed from the direct-lighting type planar light-emitting device (planar light source device), the phosphor particles may be formed into the shape of a layer, and the resulting layered phosphor particles (phosphor particle layer) may be disposed between the light source and the image display device. Furthermore, the phosphor particle layer may be disposed between the light source and the above-described light diffusion plate and the group of optically functional sheets, be disposed between the light diffusion plate and the group of optically functional sheets, or be disposed between the group of optically functional sheets.

The edge-light type planar light-emitting device (planar light source device) is provided with a light guide plate. Examples of materials constituting the light guide plate may include glass and plastic materials (for example, PMMA, polycarbonate resins, acrylic resins, amorphous polypropylene based resins, and styrene based resins containing AS resins) and forming may be performed on the basis of the above-described various forming methods, e.g., the injection molding method. The light guide plate has a first surface (bottom surface), a second surface (top surface) opposite to the first surface, a first side surface, a second side surface, a third side surface opposite to the first side surface, and a fourth side surface opposite to the second side surface. More specific examples of the shapes of the light guide plate include a cuneiform truncated quadrangular pyramid as a whole. In this case, two side surfaces opposite to each other of the truncated quadrangular pyramid correspond to the first surface and the second surface and the bottom surface of the truncated quadrangular pyramid corresponds to the first side surface. It is desirable that convex portions and/or concave portions are disposed on the surface portion of the first (bottom) surface. Light is incident from the first side surface of the light guide plate and the light is emitted from the second surface (top surface) toward the image display device. The second surface of the light guide plate may be smooth (that is, may be a mirror finished surface) or be provided with blast grain having a diffusing effect (that is, may be a fine uneven surface).

It is desirable that convex portions and/or concave portions are disposed on the first surface (bottom surface). That is, it is desirable that convex portions are disposed, concave portions are disposed, or an uneven portion is disposed on the first surface of the light guide plate. In the case where the uneven portion is disposed, the convex portions may be continuous with the concave portions or be discontinuous. The convex portions and/or the concave portions disposed on the first surface of the light guide plate may be continuous convex portions and/or concave portions extending along the direction which forms a predetermined angle with the direction of the light incident on the light guide plate. Regarding such a configuration, examples of continuous convex-shaped or concave-shaped cross-sectional shapes, where the image display device is cut along a virtual plane which is in the direction of the light incident on the light guide plate and which is perpendicular to the first surface, may include a triangle; any tetragon including a square, a rectangle, and a trapezoid; any polygon; a circle, an ellipse, a parabola, a hyperbola, and a smooth curve including a catenary and the like. In this regard, the direction which forms a predetermined angle with the direction of the light incident on the light guide plate refers to a direction of 60 degrees to 120 degrees, where the direction of the light incident on the light guide plate is assumed to be 0 degrees. The same goes for the following description. Alternatively, the convex portions and/or the concave portions disposed on the first surface of the light guide plate may be discontinuous convex portions and/or concave portions extending along the direction which forms a predetermined angle with the direction of the light incident on the light guide plate. Regarding such a configuration, examples of discontinuous convex or concave shapes may include a pyramid, a circular cone, a circular column, polygonal columns including a triangular column and a quadrangular column, and various smoothly-curved surface, e.g., a part of a sphere, a part of a spheroid, a part of a parabola of revolution, and a part of a hyperbola of revolution. In some cases, convex portions and concave portions are not disposed on a peripheral portion of the first surface of the light guide plate. The light emitted from the light source and incident on the light guide plate is scattered through collision to the convex portions or the concave portions disposed on the first surface of the light guide plate. The height or depth, the pitch, and the shape of the convex portions or the concave portions disposed on the first surface of the light guide plate may be specified to be constant or be changed with decreasing proximity to the light source. In the latter case, for example, the pitch of the convex portions or the concave portions may be reduced with decreasing proximity to the light source. The pitch of the convex portions or the pitch of the concave portions refers to the pitch of the convex portions or the pitch of the concave portions along the direction of the light incident on the light guide plate.

Regarding the planar light-emitting device provided with the light guide plate, a reflection member may be disposed opposing to the first surface (bottom surface) of the light guide plate. Furthermore, the image display device is disposed opposing to the second surface (top surface) of the light guide plate.

In the case where the light-emitting device is formed from the edge light type planar light-emitting device, the phosphor particles may be formed into the shape of a layer, and the resulting layered phosphor particles (phosphor particle layer) may be disposed between the second surface (top surface) of the light guide plate and the image display device. The light emitted from the light source is incident on the light guide plate from the first side surface (for example, a surface corresponding to the bottom surface of a truncated quadrangle pyramid) of the light guide plate, is scattered through collision with the convex portions or the concave portions on the first surface (bottom surface), is emitted from the first surface (bottom surface), is reflected by the reflection member, is entered again into the first surface (bottom surface), is emitted from the second surface (top surface), is passed through the phosphor particle layer, and is applied to the image display device. Furthermore, the phosphor particle layer may be disposed between the light source and the above-described light diffusion plate and the group of optically functional sheets or be disposed between the light diffusion plate and the group of optically functional sheets. Alternatively, the phosphor particle layer may be disposed between the light source and the first side surface of the light guide plate. Alternatively, the phosphor particle layer may be disposed between the reflection member opposite to first surface (bottom surface) of the light guide plate and the first surface (bottom surface) of the light guide plate. In this regard, the phosphor particle layer may be disposed on the second surface (top surface) of the light guide plate, be disposed on the first side surface of the light guide plate, or be disposed on the first surface (bottom surface) of the light guide plate. The light emitted from the light source may be led to the light guide plate directly or be led to the light guide plate indirectly. In the latter case, for example, an optical fiber may be used.

Regarding the methods for manufacturing green-emitting phosphor particles according to the embodiments of the present invention including the above-described various preferable forms and configurations, the color conversion sheet according to the embodiment of the present invention, the light-emitting device according to the embodiment of the present invention, or the image display device assembly according to the embodiment of the present invention, the median diameter ($D_{50}$) of the green-emitting phosphor particles may be 1 μm to 7 μm.

In the methods for manufacturing green-emitting phosphor particles according to the embodiments of the present invention including the above-described various preferable forms and configurations (hereafter these are generically simply referred to as "manufacturing methods according to the embodiments of the present invention"), examples of europium compounds may include europium salts, specifically, europium nitrate [$Eu(NO_3)_3 \cdot xH_2O$], europium oxalate [$Eu_2(C_2O_4)_3 \cdot xH_2O$], europium carbonate [$Eu_2(CO_3)_3 \cdot xH_2O$], europium sulfate [$Eu_2(SO_4)_3$], europium chloride [$EuCl_3 \cdot xH_2O$], europium fluoride [$EuF_3$], europium hydride [$EuH_x$], europium sulfide [$EuS$], tri-i-propoxy europium [$Eu(O\text{-}i\text{-}C_3H_7)_3$], and europium acetate [$Eu(O\text{---}CO\text{---}CH_3)_3$]. Examples of strontium compounds include strontium salts, specifically, strontium nitrate [$Sr(NO_3)_2$], strontium oxide [$SrO$], strontium bromide [$SrBr_2 \cdot xH_2O$], strontium chloride [$SrCl_2 \cdot xH_2O$], strontium carbonate [$SrCO_3$], strontium oxalate [$SrC_2O_4 \cdot H_2O$], strontium fluoride [$SrF_2$], strontium iodide [$SrI_2 \cdot xH_2O$], strontium sulfate [$SrSO_4$], strontium hydroxide [$Sr(OH)_2 \cdot xH_2O$], and strontium sulfide [$SrS$]. Examples of powdered gallium compounds may include gallium oxide [$Ga_2O_3$], gallium sulfate [$Ga_2(SO_4)_3 \cdot xH_2O$], gallium nitrate [$Ga(NO_3)_3 \cdot xH_2O$], gallium bromide [$GaBr_3$], gallium chloride [$GaCl_3$], gallium iodide [$GaI_3$], gallium(II) sulfide [$GaS$], gallium(III) sulfide [$Ga_2S_3$], and gallium oxyhydroxide [$GaOOH$]. Examples of solvents for a solution containing a europium compound and a strontium compound may include pure water, a nitric acid aqueous solution, an ammonia aqueous solution, a hydrochloric acid aqueous solution, a sodium hydroxide aqueous solution, and mixed aqueous solutions thereof. Examples of sulfites include ammonium sulfite, sodium sulfite, and potassium sulfite. Besides the sulfites, carbonates (specifically, sodium carbonate, potassium carbonate, and magnesium carbonate) may be used.

As for a general composition of the powder in the manufacturing methods according to the embodiments of the present invention, besides the above-described sulfurous acid compounds containing europium and strontium, sulfuric acid compounds and carbonates may be mentioned. Furthermore, a powder containing europium and an alkaline earth metal (excluding radium) may be produced from a solution containing a europium compound and an alkaline earth metal (excluding radium) instead of production of the powder containing europium and strontium from the solution containing the europium compound and the strontium compound and, thereafter, the resulting powder and a powdered gallium compound may be mixed, followed by firing so as to produce the green-emitting phosphor particles according to embodiments of the present invention.

Regarding the color conversion sheet, the light-emitting device, or the image display device assembly including the above-described various preferable forms, it is preferable that the transparent base material used is formed from a material which transmits at least 80% of the light from the light source. Examples of the first transparent base member, the second transparent base member, and the transparent base member may include glass substrates, specifically high-strain point glass, soda glass ($Na_2O \cdot CaO \cdot SiO_2$), borosilicate glass ($Na_2O \cdot B_2O_3 \cdot SiO_2$), forsterite ($2MgO \cdot SiO_2$), lead glass ($Na_2O \cdot PbO \cdot SiO_2$), and non-alkali glass. Alternatively, examples thereof may include organic polymers (having a form of a polymer material, e.g., a plastic film, a plastic sheet, and a plastic substrate, which are composed of a polymer material and which has flexibility) exemplified by polymethyl methacrylate (polymethacrylic acid methyl, PMMA), polyvinyl alcohol (PVA), polyvinyl phenol (PVP), polyether sulfone (PES), polyimide, polycarbonate (PC), polyethylene terephthalate (PET), polystyrene (PS), polyethylene naphthalate (PEN), cyclic amorphous polyolefin, polyfunctional acrylate, polyfunctional polyolefin, unsaturated polyester, and epoxy resin. Specific examples of light sources may include light-emitting elements (for example, light-emitting diodes and semiconductor lasers) to emit light (blue light) with a wavelength having any one of values within the range of 440 nm to 460 nm, fluorescent lamps, electroluminescence light emitting devices, and plasma light-emitting devices. The location of the light source, the state of the light source, and the number of light sources are basically optional and may be determined appropriately on the basis of the specifications of the light-emitting device and the image display device assembly.

By the way, the light-emitting diode (LED) has a laminated structure composed of, for example, a first compound semiconductor layer having a first electrical conductivity type (for example, n-type), an active layer disposed on the first compound semiconductor layer, and a second compound semiconductor layer, which is disposed on the active layer and which has a second electrical conductivity type (for example, p-type), and is provided with a first electrode electrically connected to the first compound semiconductor layer and a second electrode electrically connected to the second compound semiconductor layer. The layer constituting the light-emitting diode may be formed from a compound semiconductor material in related art in accordance with the emission wavelength. Likewise, the substrate may be formed from a material in related art, for example, sapphire (refractive index: 1.785), GaN (refractive index: 2.438), GaAs (refractive index: 3.4), AlInP (refractive index: 2.86), or alumina (refractive index: 1.78). The light-emitting diode (LED) may have a face-up structure or have a flip-chip structure.

In general, the color temperature of the light-emitting diode depends on an operation current. Therefore, in order to reproduce the color faithfully while predetermined brightness is ensured, that is, in order to maintain the constant color temperature, it is preferable that the light-emitting diode is driven by a pulse width modulation (PWM) signal. In the case where the duty ratio of the pulse width modulation (PWM) signal is changed, changes in average forward current and the brightness of the light-emitting diode change linearly.

The light-emitting element is usually attached to a substrate. The substrate is not specifically limited, but it is preferable that the substrate endures the heat emitted from the light-emitting element and has an excellent heat dissipation effect. Specific examples of substrates may include a metal core printed wiring board provided with wirings on one surface or both surfaces, a multilayer metal core printed wiring board, a metal base printed wiring board provided with wirings on one surface or both surfaces, a multilayer metal base printed wiring board, a ceramic wiring board provided with wirings on one surface or both surfaces, and multilayer ceramic wiring board. As for the methods for manufacturing these various printed wiring boards, the methods in related art may be employed. Examples of methods for electrically connecting the light-emitting element to the circuits disposed on the substrate (mounting methods) may include a die bond method, a wire bond method, combinations of these methods, and a system by using sub-mount, although depending on the structure of the light-emitting element. In this regard, examples of the die bond method may include a method by using a solder ball, a method by using a solder paste, a method in which bonding is performed by melting AuSn eutectic solder, and a method in which gold bumps are formed and joining is performed by using ultrasonic waves. As for the method for attaching the light-emitting element to the substrate, a method in related art may be employed. Moreover, it is desirable that the substrate is fixed to a heat sink.

Examples of red-emitting particles constituting the color conversion layer according to the embodiments of the present invention, red-emitting particles constituting the phosphor particles in the light-emitting device according to the embodiments of the present invention, and red-emitting particles constituting the phosphor particles in the image display device assembly according to the embodiments of the present invention may include red-emitting phosphor particles, e.g., (ME:Eu)S, (M:Sm)$_x$(Si,Al)$_{12}$(O,N)$_{16}$, ME$_2$Si$_5$N$_8$:Eu, (ME:Eu)SiN$_2$, (ME:Eu)AlSiN$_3$, (ME:Eu)$_3$SiO$_5$, (Ca:Eu)SiN$_2$, (Ca:Eu)AlSiN$_3$, Y$_2$O$_3$:Eu, YVO$_4$:Eu, Y(P,V)O$_4$:Eu, 3.5MgO.0.5MgF$_2$.Ge$_2$:Mn, CaSiO$_3$:Pb,Mn, Mg$_6$AsO$_{11}$:Mn, (Sr,Mg)$_3$(PO$_4$)$_3$:Sn, La$_2$O$_2$S:Eu, and Y$_2$O$_2$S:Eu. Here, "ME" refers to at least one type of atom selected from the group consisting of Ca, Sr, and Ba, and "M" refers to at least one type of atom selected from the group consisting of Li, Mg, and Ca. Alternatively, for example, light-emitting particles may be mentioned, wherein in an indirect transition type silicon based material, the wave function of the carrier is localized, a quantum effect is used, and a quantum well structure, e.g., a two-dimensional quantum well structure, one-dimensional quantum well structure (quantum wire), or zero-dimensional quantum well structure (quantum dot), is applied in order to convert carriers to light efficiently, as in a direct transition type. It is common knowledge that a rare-earth atom added to a semiconductor material emits light sharply through intra-shell transition and, therefore, light-emitting particles, to which such a technology is applied, may also be mentioned.

The phosphor particles in the color conversion layer according to the embodiments of the present invention, the light-emitting device according to the embodiments of the present invention, or the image display device assembly according to the embodiments of the present invention are composed of green-emitting phosphor particles or are composed of green-emitting phosphor particles and red-emitting particles. As for other constituents, a binder, cyan-emitting phosphor particles, yellow-emitting phosphor particles, and a dispersing agent formed from glass beads may be mentioned. In the case where the phosphor particles are composed of the green-emitting phosphor particles and the red-emitting particles, the color conversion layer may be produced by mixing the green-emitting phosphor particles and the red-emitting particles.

The median diameter ($D_{50}$) may be determined by the following method through the use of LA500, which is a light scattering type particle size distribution analyzer, produced by Horiba, Ltd. That is, the median diameter ($D_{50}$) and the particle size distribution may be measured by dispersing the phosphor particles into ethanol, effecting deflocculation through the use of ultra sonic waves, putting the phosphor particles into a solvent, moving the resulting mixture in a tube, illuminating the tube with a light source, performing projection to a photodiode array, and monitoring the shadow of phosphor particles with the photodiode array. Furthermore, the internal quantum efficiency, the absorption efficiency, and the external quantum efficiency may be determined by the following method through the use of integrating-sphere option of FP-6500 produced by JASCO Corporation. That is, barium sulfate is used as a reference, the reflectance of barium sulfate is assumed to be 100%, the phosphor particles are packed into a standard jig, and the internal quantum efficiency, the external quantum efficiency, and the absorption efficiency are calculated by comparison with barium sulfate.

Regarding the image display device assembly according to the embodiments of the present invention, as for the image display device, a liquid crystal display device may be mentioned. More specific example of the liquid crystal display device may include transmissive and transflective color liquid crystal display devices. These liquid crystal display devices are formed from, for example, a front panel provided with a transparent first electrode, a rear panel provided with a transparent second electrode, and a liquid crystal material disposed between the front panel and the rear panel.

More specifically, the front panel includes, for example, a first substrate composed of a glass substrate or a silicon substrate, the transparent first electrode (may be referred to as a common electrode and is formed from, for example, ITO) disposed on an inside surface of the first substrate, and a polarization film disposed on an outside surface of the first substrate. Furthermore, the front panel is provided with a color filter covered with an overcoat layer formed from an acrylic resin or an epoxy resin on the inside surface of the first substrate. In general, the color filter is composed of a black matrix (formed from, for example, chromium) to shade gaps between coloring patterns and coloring layers of, for example, blue, green, and red opposed to each subpixel, and is produced by a staining method, a pigment dispersion method, a printing method, an electrodeposition method, or the like. The coloring layer is formed from, for example, a resin material, or be colored with a pigment. The pattern of the coloring layer may be made coincide with the arrangement state (arrangement pattern) of the subpixels. Examples thereof may include delta arrangement, a stripe arrangement, a diagonal arrangement, and a rectangle arrangement. Moreover, the front panel has a configuration in which the transparent first electrode is disposed on the over coat layer. An alignment film is disposed on the transparent first electrode. Meanwhile, more specifically, the rear panel includes, for example, a second substrate composed of a glass substrate or a silicon substrate, a switching element disposed on the inside surface of the second substrate, the transparent second electrode (may be referred to as a pixel electrode and is formed from, for example, ITO), in which conduction/nonconduction is controlled by the switching element, and a polarization film disposed on an outside surface of the second substrate. An alignment film is disposed all over the surface including the transparent second electrode. Various members and liquid crystal materials constituting these transmissive or transflective color liquid crystal display devices may be formed from members and materials in related art. Examples of switching elements may include three-terminal elements, e.g., MOS type FET disposed on a single crystal silicon semiconductor substrate and a thin film transistor (TFT) disposed on a glass substrate, and two-terminal elements, e.g., MIM elements, varistor elements, and diodes. As for the drive system of the liquid crystal material, a drive system suitable for the liquid crystal material used may be employed.

Examples of the first substrate and the second substrate include a glass substrate, a glass substrate provided with an insulating film on the surface, a quartz substrate, a quartz substrate provided with an insulating film on the surface, and a semiconductor substrate provided with an insulating film on the surface. From the viewpoint of production cost reduction, it is preferable that the glass substrate or the glass substrate provided with an insulating film on the surface is used. Examples of glass substrates may include high-strain point glass, soda glass ($Na_2O \cdot CaO \cdot SiO_2$), borosilicate glass ($Na_2O \cdot B_2O_3 \cdot SiO_2$), forsterite ($2MgO \cdot SiO_2$), lead glass ($Na_2O \cdot PbO \cdot SiO_2$), and non-alkali glass. Alternatively, examples thereof may include organic polymers (having a form of a polymer material, e.g., a plastic film, a plastic sheet, and a plastic substrate, which are composed of a polymer material and which has flexibility) exemplified by polymethyl methacrylate (polymethacrylic acid methyl, PMMA), polyvinyl alcohol (PVA), polyvinyl phenol (PVP), polyether sulfone (PES), polyimide, polycarbonate (PC), and polyethylene terephthalate (PET).

A region, which is an overlapping region of the transparent first electrode and the transparent second electrode and which includes a liquid crystal cell, corresponds to one subpixel. For example, a red-emitting subpixel (may be referred to as subpixel R) constituting each pixel is formed from a combination of a liquid crystal cell constituting the above-described region and a color filter which transmits red light. A green-emitting subpixel (may be referred to as subpixel G) is formed from a combination of a liquid crystal cell constituting the above-described region and a color filter which transmits green light. A blue-emitting subpixel (may be referred to as subpixel B) is formed from a combination of a liquid crystal cell constituting the above-described region and a color filter which transmits blue light. The arrangement pattern of the subpixel R, the subpixel G, and the subpixel B agrees with the arrangement pattern of the above-described color filters. The configuration of the pixel is not limited to the configuration in which three types of subpixels R, G, and B, that is, subpixel R, subpixel G, and subpixel B, are assumed to be one set. For example, the pixel may be composed of one set in which at least one type of subpixel is further added to theses three types of subpixels R, G, and B (for example, one set including a subpixel emitting white light to improve the brightness, one set including a subpixel emitting light of complementary color to enlarge a color reproduction range, one set including a subpixel emitting yellow to enlarge a color reproduction range, one set including a subpixel emitting magenta to enlarge a color reproduction range, or one set including a subpixel emitting yellow and cyan to enlarge a color reproduction range). In the case of a so-called field sequential liquid crystal display device in which color display is performed by switching the emission states of red, green, and blue through time division at a high speed, a color filter separated on a subpixel basis is not necessary.

Example 1

Example 1 relates to the green-emitting phosphor particles according to the embodiments of the present invention and the methods for manufacturing green-emitting phosphor particles according to the embodiments of the present invention.

In Example 1, green-emitting phosphor particles were obtained by the following manufacturing method. That is, in Example 1, a powdered gallium compound was added to a solution containing a europium compound and a strontium compound, and a salt was added so as to produce a powder. Specifically, a powder was produced by adding a salt to precipitate the europium compound and the strontium compound. Thereafter, the resulting powder was fired. That is, the powder (powder mixture) composed of a mixture of a powder containing europium and strontium and a powdered gallium compound was produced by adding the powdered gallium to a solution containing the europium compound and the strontium compound and adding the salt and, thereafter, the resulting powder (powder mixture) was fired. Here, the powder containing Sr, Eu, and Ga was produced by adding the powdered gallium compound to the solution containing the europium compound and the strontium compound and dropping a sulfite.

Initially, $Ga_2O_3$ (purity 7 N), $Sr(NO_3)_2$ (purity 3 N), and $Eu_2O_3$ (purity 3 N), which were reagents produced by Kojundo Chemical Laboratory Co., Ltd., and nitric acid aqueous solution (concentration 20%) and ammonium sulfite monohydrate, which were produced by KANTO CHEMICAL CO., INC., were prepared.

Subsequently, $Eu_2O_3$ was added to the nitric acid aqueous solution and agitation was performed at 80° C. so as to dissolve $Eu_2O_3$ into the nitric acid aqueous solution. Then, the solvent was vaporized and, thereby, $Eu(NO_3)_3$ was produced.

Next, the europium compound $Eu(NO_3)_3$ and the strontium compound $Sr(NO_3)_2$ were added to 500 milliliters of pure water, followed by agitation. In this manner, the solution containing the europium compound and the strontium compound was produced. In this regard, the value of x was changed by changing the ratio of $Eu(NO_3)_3$ to $Sr(NO_3)_2$ and, thereby, the concentration of Eu serving as an emission center was adjusted. Thereafter, a desired proportion of powdered gallium compound (specifically, powdered $Ga_2O_3$) was added to the resulting solution, and the sulfite was dropped into the resulting solution while agitation was performed. Specifically, precipitates and sediments were produced by dropping a solution containing ammonium sulfite having the mole number 1.5 times the mole number of Sr and Eu in total while the solution was agitated. The resulting precipitates and sediments contained Sr, Eu, and Ga and, more specifically, was a mixture of a europium strontium sulfite powder and a gallium oxide powder. The sediments were washed with water, filtrated, and dried at 120° C. for 6 hours until the conductivity became 0.1 mS/cm or less, so that a powder containing europium, strontium, and gallium was produced. That is, a powder mixture composed of a mixture of a powder containing europium and strontium and a powdered gallium compound, more specifically, a mixture of a europium strontium sulfite powder (a powder composed of $(Sr,Eu)SO_3$) and a gallium oxide powder was produced. As described above, the method for producing the powder containing europium, strontium, and gallium in Example 1 is a wet method (that is, a method in which starting substances are generated in a liquid phase).

Then, 20 grams of the thus produced powder (powder mixture), 200 grams of zirconia balls, and 200 milliliters of ethanol were put into a 500 milliliter pot, and were mixed by rotating at a rotation speed of 90 rpm for 30 minutes. After the mixing was completed, filtration and drying at 120° C. for 6 hours were performed. Subsequently, the resulting mixture was passed through a wire gauze having a nominal opening size of 100 µm and, thereby, a powder mixture was produced.

Then, the resulting powder mixture was fired in an electric furnace. The firing condition was specified as described below. That is, the temperature was raised to 925° C. over 1.5 hours, and was kept at 925° C. for 1.5 hours. Next, the temperature was lowered to room temperature over 2 hours. During the firing, hydrogen sulfide was passed through the electric furnace at a rate of 0.5 liters/min. Thereafter, the resulting mixture was passed through a mesh having a nominal opening size of 25 µm and, thereby, green-emitting phosphor particles composed of $Sr_{1-x}Ga_2S_4:Eu_x$ in Example 1 were produced. The green-emitting phosphor particles in Example 1 were composed of $Sr_{1-x}Ga_2S_4:Eu_x$ (where $0.10 \leq x \leq 0.20$, preferably $0.10 \leq x \leq 0.18$), and the value of (internal quantum efficiency/absorption efficiency) was 0.7 or more.

Regarding Comparative example 1, green-emitting phosphor particles were produced by a manufacturing method described below.

The same $Ga_2O_3$ and $Eu_2O_3$ as those in Example 1 were prepared and, in addition, $SrSO_4$ (purity 3 N), which was a reagent produced by Kojundo Chemical Laboratory Co., Ltd., was prepared.

Subsequently, $Ga_2O_3$, $Eu_2O_3$, and $SrSO_4$ were blended in such a way that a desired $Sr_{1-x}Ga_2S_4:Eu_x$ composition ratio was achieved, and were mixed by the same method as that in Example 1 through the use of a ball mill. That is, in Comparative example 1, a dry method was adopted. After the mixing was completed, filtration and drying at 80° C. for 6 hours were performed. Then, the resulting mixture was passed through a wire gauze having a nominal opening size of 100 µm. The resulting powder mixture was fired in an electric furnace. The firing condition was specified as described below. That is, the temperature was raised to 500° C. over 1 hour. Thereafter, the temperature was raised to 930° C. over 1 hour, and was kept at 930° C. for 4 hours. Next, the temperature was lowered over 2 hours. During the firing, hydrogen sulfide was passed through the electric furnace at a rate of 0.5 liters/min. Subsequently, the resulting mixture was passed through a mesh having a nominal opening size of 25 µm and, thereby, green-emitting phosphor particles composed of $Sr_{1-x}Ga_2S_4:Eu_x$ in Comparative example 1 were produced. The concentration of Eu serving as an emission center was adjusted by changing x in the blending.

Figure 4A:
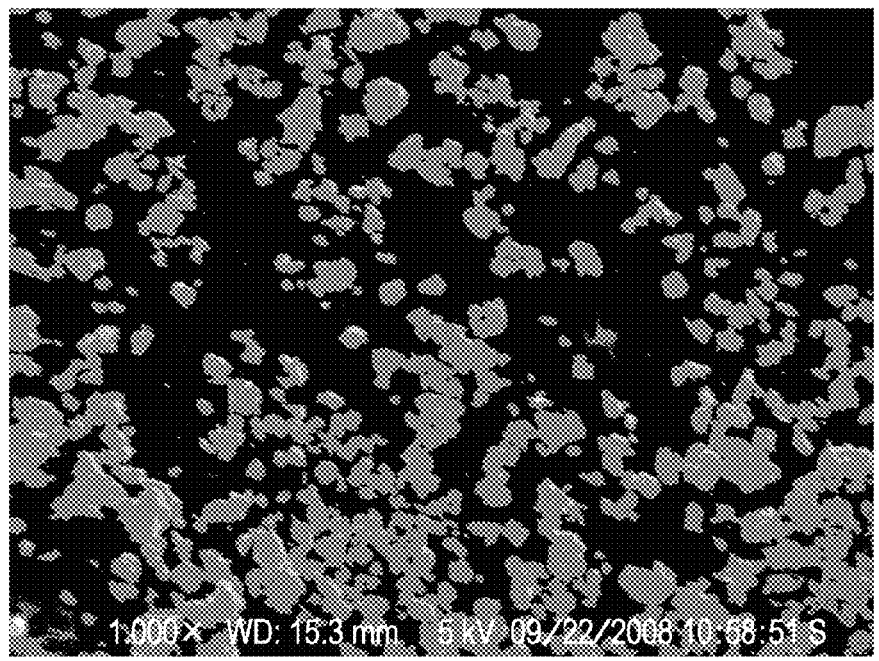
FIGS. 4A and 4B are scanning electron micrographs of the green-emitting phosphor particles in Example 1 and Comparative example 1.
Figure 4B:
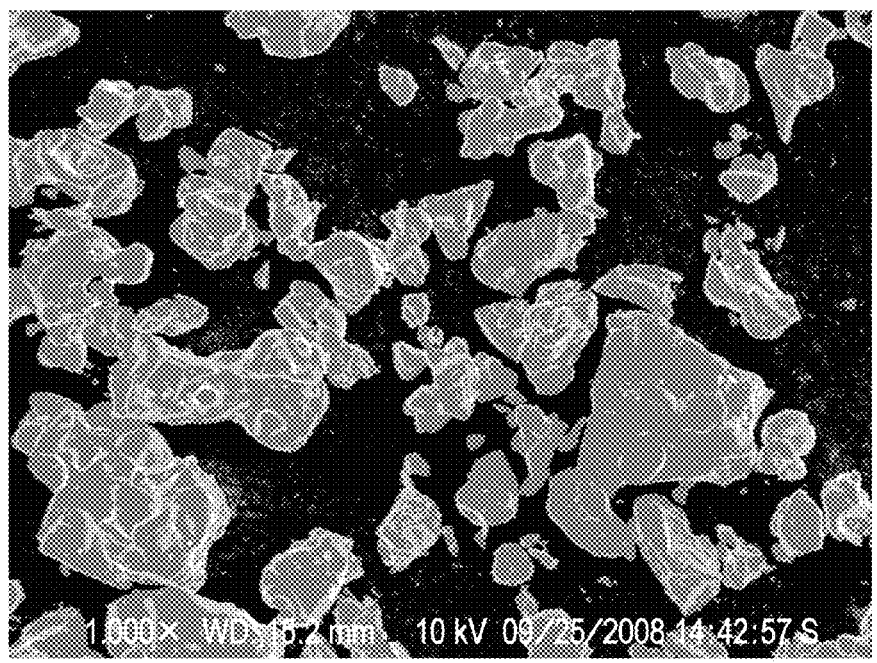

FIGS. 4A and 4B show scanning electron micrographs of the green-emitting phosphor particles in Example 1 and Comparative example 1, respectively. It is clear that the particle diameters of the green-emitting phosphor particles in Example 1 are smaller than those of the green-emitting phosphor particles in Comparative example 1. The measurement result of the median diameter ($D_{50}$) of green-emitting phosphor particles in Example 1 was 1 µm to 7 µm, although there were variations depending on the samples produced. On the other hand, the median diameter ($D_{50}$) of green-emitting phosphor particles in Comparative example 1 was 8.3 µm to 15 µm.

Figure 2:
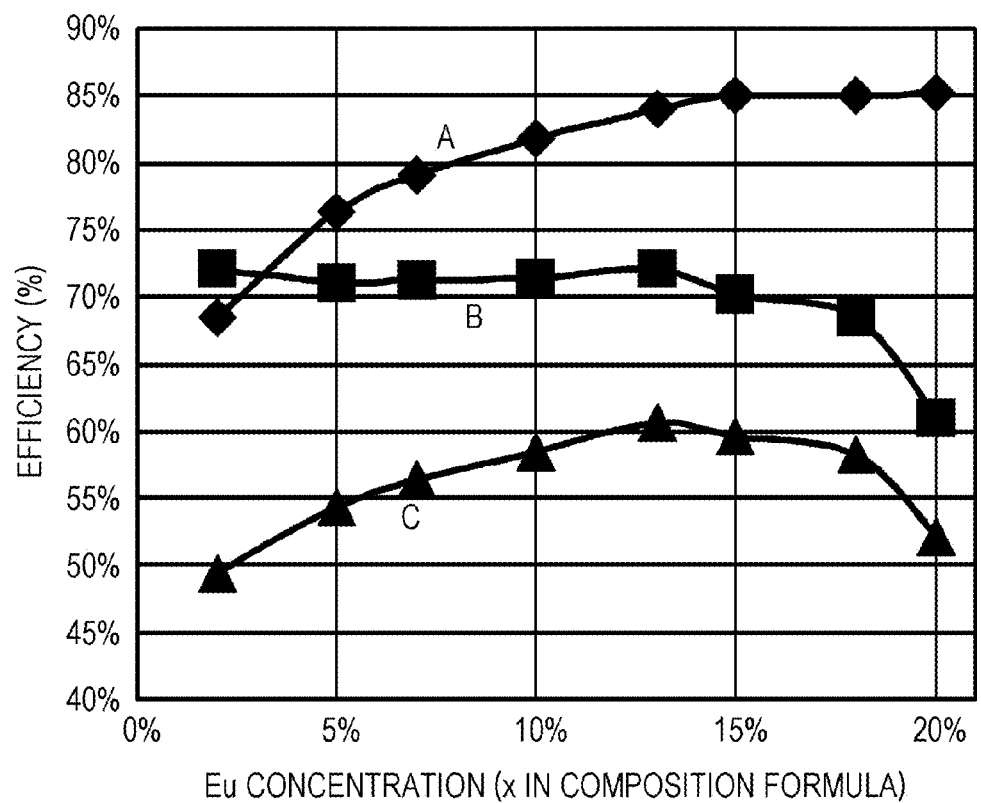
FIG. 2 is a graph showing the measurement results of the absorption efficiency, the internal quantum efficiency, and the external quantum efficiency of the green-emitting phosphor particles in Example 1.
Figure 3:
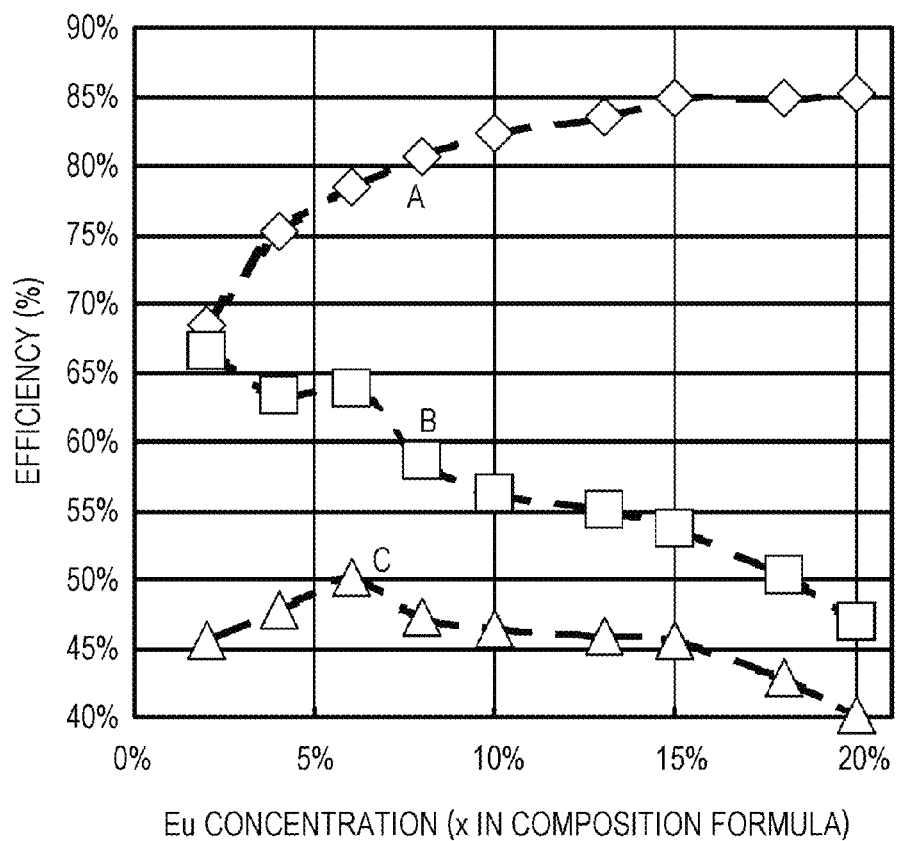
FIG. 3 is a graph showing the measurement results of the absorption efficiency, the internal quantum efficiency, and the external quantum efficiency of the green-emitting phosphor particles in Comparative example 1.

The measurement results of the absorption efficiency, the internal quantum efficiency, and the external quantum efficiency of the green-emitting phosphor particles in Example 1 and Comparative example 1 are shown in FIG. 2 and FIG. 3, respectively, and the calculation value of (internal quantum efficiency/absorption efficiency) is shown in FIG. 1. In FIG. 1, "A" indicates a calculation value regarding the green-emitting phosphor particles in Example 1, and "B" indicates a calculation value regarding the green-emitting phosphor particles in Comparative example 1. In FIG. 2 and FIG. 3, "A" indicates the measurement result of the absorption efficiency, "B" indicates the measurement result of the internal quantum efficiency, and "C" indicates the measurement result of the external quantum efficiency.

As is clear from FIG. 3, regarding the green-emitting phosphor particles in Comparative example 1, the internal quantum efficiency decreases as the value of x increases. On the other hand, the absorption efficiency increases as the value of x increases. The external quantum efficiency has a maximum peak at x=0.06. The value of the external quantum efficiency at that time is 50%.

Meanwhile, as is clear from FIG. 2, regarding the green-emitting phosphor particles in Example 1, the internal quantum efficiency exhibits a high value in spite of the fact that the Eu concentration is increased close to x=0.15. The external quantum efficiency has a maximum peak at x=0.13. The value of the external quantum efficiency at that time is 61%.

Regarding the green-emitting phosphor particles in Example 1, the calculation value of (internal quantum efficiency/absorption efficiency) is 70% or more even at x=0.20. On the other hand, regarding the green-emitting phosphor particles in Comparative example 1, the value becomes less than 70% at x=0.10. It is common knowledge that concentration quenching occurs resulting from the interaction between Eu atoms, and it is believed that the interaction occurs easily when the distance between Eu atoms is small (cross deactivation). Regarding the green-emitting phosphor particles in Comparative example 1, the dry method is adopted, and it is believed that in the state in which the Eu concentration is high, a region having a high Eu concentration is present locally and, thereby, cross deactivation occurs easily. On the other hand, regarding the green-emitting phosphor particles produced by the manufacturing method in Example 1, (Sr, Eu)$SO_3$ is produced by the wet method, and it is predicted that Eu is dispersed uniformly. Therefore, it is believed that cross deactivation does not occur easily as compared with Comparative example 1 because a region having a high Eu concentration is not present locally. As a result, it is believed that the green-emitting phosphor particles in Example 1 maintain a high internal quantum efficiency even when the absorption efficiency increases.

Figure 5:
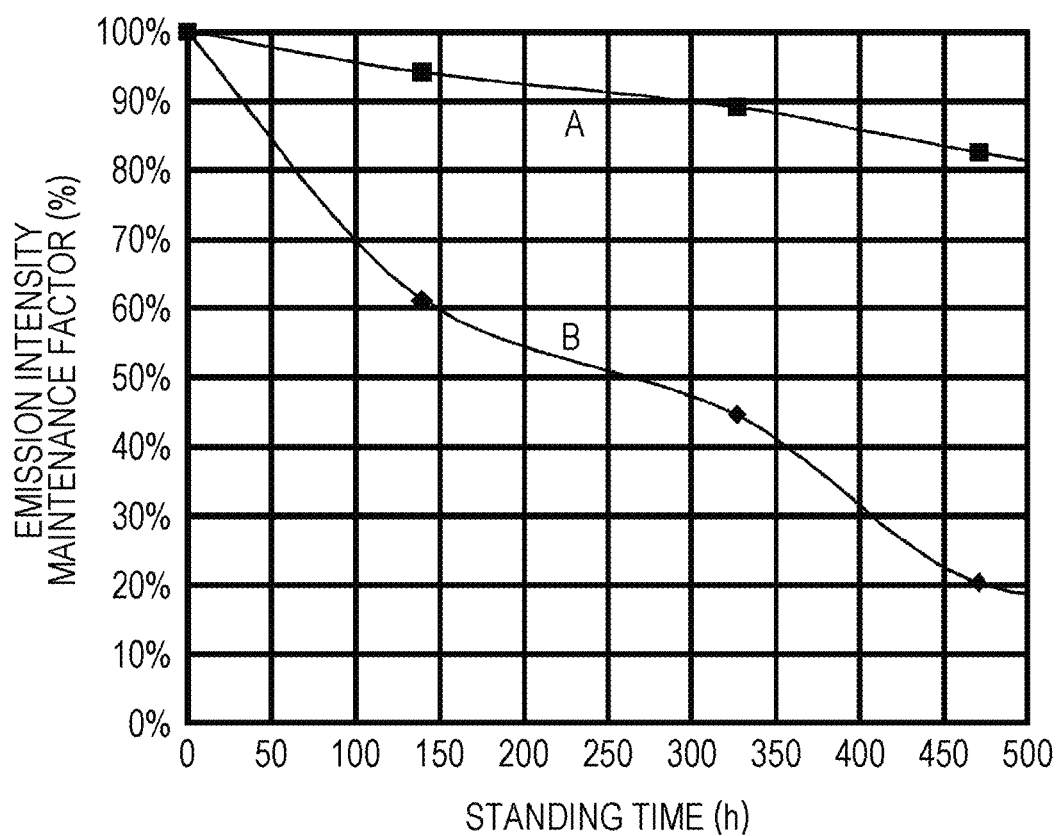
FIG. 5 is a graph showing the reliability test results of the green-emitting phosphor particles in Example 1 and Comparative example 1.

The green-emitting phosphor particles in Example 1, where x=0.15, and the green-emitting phosphor particles in Comparative example 1, where x=0.06, were stood in an atmosphere at a temperature of 85° C. and a relative humidity of 85%, and the degree of change in emission intensity with the passage of time was examined. FIG. 5 shows the results thereof. According to the results, variations in emission intensity with time of the green-emitting phosphor particles in Example 1 indicated by "A" were smaller than that of the green-emitting phosphor particles in Comparative example 1 indicated by "B". Therefore, it was made clear that the green-emitting phosphor particles in Example 1 exhibited high reliability.

Alternatively, green-emitting phosphor particles may be produced by the following method (modified example of Example 1). That is, a powder (intermediate powder) containing europium and strontium is produced from the solution containing the europium compound and the strontium compound. Thereafter, the resulting powder (intermediate powder) and the powdered gallium compound are mixed and fired. Here, a sulfite is dropped into a solution containing the europium compound and the strontium compound so as to produce a powder (intermediate powder) composed of (Sr, Eu)$SO_3$. The mixing of the powder (intermediate powder) and the powdered gallium compound is performed by using a ball mill.

Specifically, $Eu_2O_3$ described above was added to a nitric acid aqueous solution and agitation was performed at 80° C. so as to dissolve $Eu_2O_3$ into the nitric acid aqueous solution. Thereafter, the solvent was vaporized and, thereby, $Eu(NO_3)_3$ was produced.

Next, the europium compound $Eu(NO_3)_3$ and the strontium compound $Sr(NO_3)_2$ were added to 500 milliliters of pure water, followed by agitation. In this manner, the solution containing the europium compound and the strontium compound was produced. In this regard, the value of x was changed by changing the ratio of $Eu(NO_3)_3$ to $Sr(NO_3)_2$ and, thereby, the concentration of Eu serving as an emission center was adjusted. Thereafter, a sulfite was dropped into the resulting solution. Specifically, (Sr,Eu)$SO_3$ was precipitated and sedimented by dropping a solution containing ammonium sulfite having the mole number 1.5 times the mole number of Sr and Eu in total while the solution was agitated. The sediments were washed with water, filtrated, and dried at 120° C. for 6 hours until the conductivity became 0.1 mS/cm or less, so that a powder (intermediate powder) containing europium and strontium, specifically, a (Sr,Eu)$SO_3$ powder was produced. As described above, the method for producing the powder (intermediate powder) containing europium and strontium in the modified example of Example 1 is a wet method (that is, a method in which starting substances are generated in a liquid phase).

Then, desired proportions of the thus produced powder (powder mixture) and the powdered gallium compound (specifically, powdered $Ga_2O_3$) were mixed by using a ball mill. Specifically, 20 grams of powder mixture, 200 grams of zirconia balls, and 200 milliliters of ethanol were put into a 500 milliliter pot, and were mixed by rotating at a rotation speed of 90 rpm for 30 minutes. After the mixing was completed, filtration and drying at 120° C. for 6 hours were performed. Subsequently, the resulting mixture was passed through a wire gauze having a nominal opening size of 100 μm.

Then, the resulting powder mixture was fired in an electric furnace. The firing condition was specified as described below. That is, the temperature was raised to 925° C. over 1.5 hours, and was kept at 925° C. for 1.5 hours. Next, the temperature was lowered to room temperature over 2 hours. During the firing, hydrogen sulfide was passed through the electric furnace at a rate of 0.5 liters/min. Thereafter, the resulting mixture was passed through a mesh having a nominal opening size of 25 μm and, thereby, green-emitting phosphor particles composed of $Sr_{1-x}Ga_2S_4$:$Eu_x$ in Example 1 were produced. The green-emitting phosphor particles in the modified example of Example 1 were also composed of $Sr_{1-x}Ga_2S_4$:$Eu_x$ (where $0.10 \leq x \leq 0.20$, preferably $0.10 \leq x \leq 0.18$), and the value of (internal quantum efficiency/absorption efficiency) was 0.7 or more.

Example 2

Figure 6A:
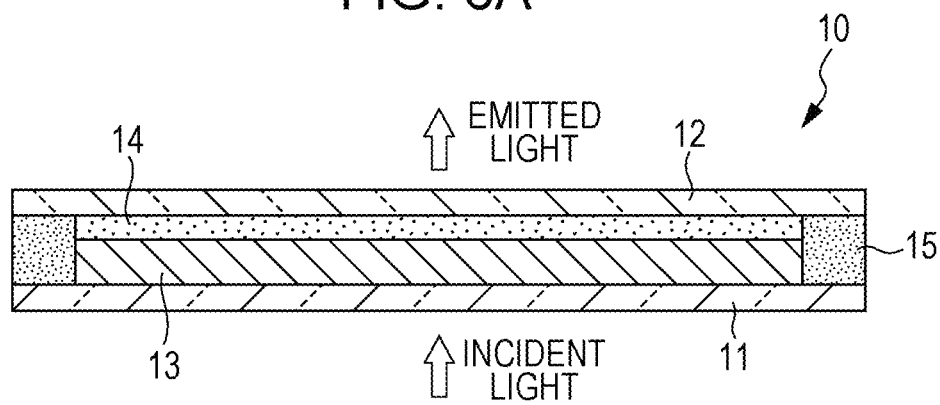
FIGS. 6A, 6B, and 6C are schematic sectional views of a color conversion sheet in Example 2.

Example 2 relates to the color conversion sheet according to the embodiments of the present invention. FIG. 6A is a schematic sectional view of a color conversion sheet 10 in Example 2. This color conversion sheet 10 includes a first transparent base member 11, a second transparent base member 12, and a color conversion layer 13 sandwiched between the first transparent base member 11 and the second transparent base member 12.

The first transparent base member 11 and the second transparent base member 12 are bonded together with a first bonding layer 14 and a second bonding layer 15 in such a way as to sandwich the color conversion layer 13. The first transparent base member 11 and the second transparent base member 12 prevent infiltration of water vapor into the color conversion layer 13 and are disposed in the light incident side and the light emission side of the color conversion layer 13 in such a way as to be opposed to each other.

The color conversion layer 13 is formed from at least green-emitting phosphor particles. Specifically, in Example 2, the color conversion layer is formed by mixing green-emitting phosphor particles and red-emitting particles (more specifically, red-emitting phosphor particles composed of CaS:Eu). The green-emitting phosphor particles are the green-emitting phosphor particles explained in Example 1 and, therefore, are composed of $(Sr,Ba,Ca)_{1-x}Ga_2S_4$:$Eu_x$ (where $0.10 \leq x \leq 0.20$, preferably $0.10 \leq x \leq 0.18$), and the value of (internal quantum efficiency/absorption efficiency) was 0.7 or more.

For example, the color conversion sheet 10 is disposed just above the light source formed from a blue-emitting diode and is used. Specifically, blue light is incident on the color conversion sheet 10 and white light is emitted from the color conversion sheet 10.

Figure 6B:
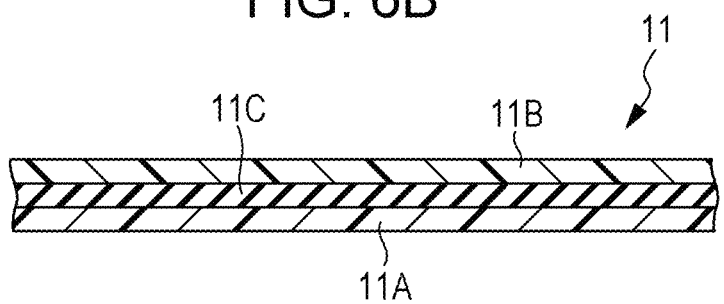

As is indicated by a schematic partial sectional view shown in FIG. 6B, the first transparent base member 11 has a configuration in which a water vapor barrier layer (impermeable layer) 11C is sandwiched between two resin sheets 11A and 11B. That is, the color conversion layer 13 is sealed by the water vapor barrier layer 11C with the resin sheet 11A or the resin sheet 11B therebetween. The resin sheets 11A and 11B may be formed from, for example, thermoplastic resins, e.g., polyethylene terephthalate (PET), polycarbonate (PC), polymethyl methacrylate (PMMA), polystyrene (PS), polyethylene naphthalate (PEN), polyether sulfone (PES), and cyclic amorphous polyolefin, polyfunctional acrylate, polyfunctional polyolefin, unsaturated polyester, and an epoxy resin from the viewpoint of transparency, workability, heat resistance, and the like. The second transparent base member 12 has the same configuration and structure as those of the first transparent base member 11.

The water vapor barrier layer 11C is formed from a material having a low water vapor permeability, for example, an inorganic material, e.g., silicon oxide, silicon nitride, magnesium oxide (MgO), indium oxide, aluminum oxide, or tin oxide, or an organic material, e.g., polyvinyl alcohol, ethylene vinyl alcohol copolymer, polyacrylonitrile, or polyvinylidene chloride and is formed from a single layer or a composite layer. It is preferable that the water vapor permeability is, for example, 2.0 g/m$^2$/day or less. Furthermore, it is preferable that a material having a low gas permeability with respect to oxygen gas or the like, in addition to the water vapor permeability, is used.

The first bonding layer 14 is disposed between the light-emitting surface of the color conversion layer 13 and the second transparent base member 12, and the second bonding layer 15 is disposed in the shape of a frame along the perimeter of the color conversion layer 13, that is, in such a way as to surround the color conversion layer 13. The above-described first bonding layer 14 and second bonding layer 15 are formed from an adhesive material having a water vapor barrier function, for example, an ultraviolet curable adhesive, a thermosetting adhesive, a tackiness agent, or a hot-melt agent. In this regard, the first bonding layer 14 is formed from a material having the transparency because of being disposed on an optical path of the light emitted from the color conversion layer 13. The second bonding layer 15 may be transparent or opaque, but it is preferable that a material having a high water vapor barrier function is used. The first bonding layer 14 is not necessarily disposed.

As described above, regarding the color conversion sheet in Example 2, the color conversion layer is sealed with the material having a high water vapor barrier function and, thereby, degradation of the color conversion layer due to water vapor can be prevented reliably.

The color conversion sheet 10 in Example 2 may be produced by, for example, a manufacturing method described below.

Initially, the first transparent base member 11 and the second transparent base member 12 having the configuration shown in FIG. 6B are produced. Specifically, the water vapor barrier layer 11C is formed on the resin sheet 11A by various film formation methods, for example, a vacuum evaporation method or a sputtering method. In the case where an organic material is used as the water vapor barrier layer 11C, the layer may be formed on the basis of various coating methods. Subsequently, the resin sheet 11B is stacked on the resulting water vapor barrier layer 11C and is adhered so as to seal the water vapor barrier layer 11C between the resin sheets 11A and 11B.

Then, the second bonding layer 15 is applied and formed on the peripheral portion of the first transparent base member 11. At this time, a portion not provided with the second bonding layer 15 (opening portion, not shown in the drawing) is disposed in the peripheral portion of the first transparent base member 11. Subsequently, the second transparent base member 12 is placed on the second bonding layer 15 in such a way as to be opposed to the first transparent base member 11, the first transparent base member 11 is adhered to the second bonding layer 15, and the second transparent base member 12 is adhered to the second bonding layer 15. Thereafter, mixture of the green-emitting phosphor particles and the red-emitting phosphor particles produced in Example 1 were put into the space surrounded by the first transparent base member 11, the second transparent base member 12, and the second bonding layer 15 through the opening portion. Then, the first bonding layer 14 is injected into the space surrounded by the second transparent base member 12, second bonding layer 15, and the phosphor particle mixture through the opening portion so as to adhere. Furthermore, the opening portion is sealed, so that the color conversion sheet 10 shown in FIG. 6A is completed.

Alternatively, production may be performed on the basis of, for example, the manufacturing method described below.

That is, the color conversion layer 13 is applied and formed in the region other than the peripheral portion of the first transparent base member 11. Subsequently, the second bonding layer 15 is formed on the peripheral portion of the first transparent base member 11 in such a way as to surround the color conversion layer 13. Then, the first bonding layer 14 is formed in such a way as to cover all over the color conversion layer 13. Thereafter, the second transparent base member 12 is placed on the first bonding layer 14 and the second bonding layer 15, the first transparent base member 11 is adhered to the second bonding layer 15, and the second transparent base member 12 is adhered to the second bonding layer 15.

Alternatively, the color conversion layer 13 is applied and formed in the region other than the peripheral portion of the first transparent base member 11. Subsequently, the first bonding layer 14 is formed in such a way as to cover all over the light-emitting side of the color conversion layer 13. Thereafter, the second transparent base member 12 is bonded from above the first bonding layer 14. Then, the second bonding layer 15 is formed in such a way as to seal between the second transparent base member 12 and the first transparent base member 11 from the outside. The color conversion sheet 10 in Example 2 may also be produced by the above-described method.

Figure 6C:
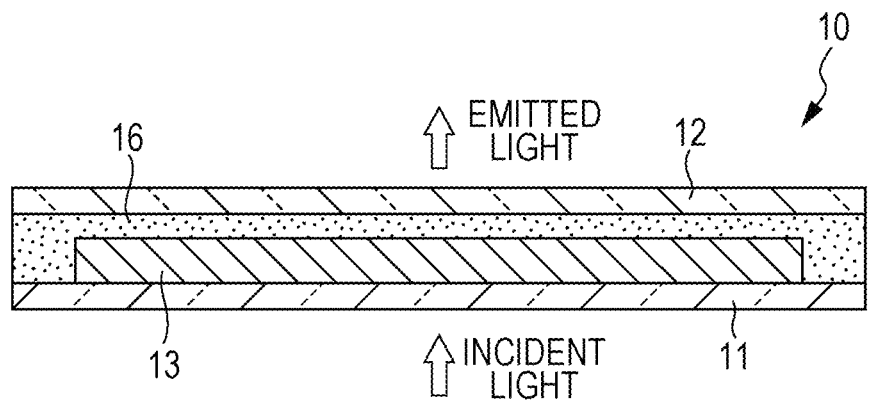

As is indicated by a schematic sectional view shown in FIG. 6C, a configuration in which a bonding layer 16 is disposed in such a way as to cover all over the color conversion layer 13 disposed on the first transparent base member 11, and the color conversion layer 13 is hermetically sealed between the first transparent base member 11 and the second transparent base member 12 with only the bonding layer 16 may be employed. The bonding layer 16 may be formed from the same material as that of the first bonding layer 14. Moreover, for example, an optically functional sheet (film) may be used as the second transparent base member 12. The optically functional sheet (film) may has a single-layer configuration of a diffusion plate, a diffusion film, a lens film, or a reflection type polarization film or a laminated configuration thereof.

The color conversion sheet 10 in Example 2 may be applied to a light-emitting device or an image display device assembly in Example 3 described below.

Example 3

Example 3 relates to the light-emitting device according to the embodiments of the present invention and the image display device assembly according to the embodiments of the present invention. FIG. 7 shows a conceptual diagram of the image display device assembly in Example 3, which includes (A) an image display device 20 and (B) a light-emitting device (specifically, a planar light-emitting device, a planar light source device) 30 to illuminate the image display device 20 from the back, wherein the light-emitting device 30 includes (a) a light source 31 and (b) phosphor particles which are excited by the light emitted from the light source.

The phosphor particles are composed of at least green-emitting phosphor particles. Specifically, in Example 3, the phosphor particles are composed of green-emitting phosphor particles and red-emitting particles, and as explained in Example 1, the green-emitting phosphor particles are composed of $(Sr,Ba,Ca)_{1-x}Ga_2S_4:Eu_x$ (where $0.10 \leq x \leq 0.20$), and the value of (internal quantum efficiency/absorption efficiency) is 0.7 or more.

The layered phosphor particles (phosphor particle layer) are disposed on the first surface of the transparent base member (first transparent base member 11), and a light source 31 is disposed opposing to the second surface of the transparent base member (first transparent base member 11) opposite to the first surface. Furthermore, the phosphor particles (phosphor particle layer) are covered with the second transparent base member 12. More specifically, this configuration is realized by the color conversion sheet 10 in Example 2. Here, the phosphor particle layer corresponds to the color conversion layer 13 in the color conversion sheet 10 in Example 2.

The image display device 20 is formed from a transmissive color liquid crystal display device in related art. Specifically, the image display device 20 formed from a color liquid crystal display device is provided with a display region in which $M_0$ pixels along a first direction and $N_0$ pixels along a second direction orthogonal to the first direction, that is, $M_0 \times N_0$ pixels in total, are arranged in the matrix. More specifically, for example, the image display resolution satisfies the HDTV standard, and the number of pixels arranged in the two-dimensional matrix is, for example, (1920,1080), where the number $M_0 \times N_0$ is expressed by $(M_0, N_0)$. Each pixel is formed from one set of a plurality of subpixels which emit mutually different colors. Each pixel is formed from three types of subpixels composed of a red-emitting subpixel (subpixel R), a green-emitting subpixel (subpixel G), and a blue-emitting subpixel (subpixel B). This image display device is line-sequentially driven. The image display device has scanning electrodes (extending along the first direction) and data electrodes (extending along the second direction) which intersect with each other in the shape of matrix. Scanning signals are input to the scanning electrodes and the scanning electrodes are selected and scanned, an image is displayed on the basis of data signals (which are signals based on control signals) input into the data electrodes and, thereby, one screen is formed.

The light-emitting device (planar light-emitting device) 30 in Example 3 is a direct-lighting type planar light-emitting device. Various optically functional films (sheets), for example, a diffusion plate 21, a diffusion film 22, a lens film (condensing member) 23, and a reflection type polarization film 24 are disposed between the image display device 20 and the light-emitting device 30 in that order from the light-emitting device 30 side. The diffusion plate 21 and the diffusion film 22 diffuse the incident light to level the intensity distribution. The lens film 23 is formed by arranging a plurality of prism-shaped protrusions side by side and has a function of condensing the incident light. The reflection type polarization film 24 is to transmit one polarized light and reflect the other polarized light downward (color conversion sheet 10 side) so as to reuse the light and, therefore, is disposed to increase the efficiency in use of the light. In FIG. 7 and FIG. 8 to FIG. 13B described later, these optically functional films (sheets) are separately shown in the drawings, although these optically functional films (sheets) may be in the state of being laminated.

The light source 31 is formed by disposing a plurality of light-emitting elements which emit blue light, specifically, a blue-emitting diode (LED, light Emitting Diode) assembly 33, on a support substrate 32 and performs surface emission as a whole. The color conversion sheet 10 explained in Example 2 is disposed just above such a light source 31. The blue light emitted from the blue-emitting diode assembly 33 is incident on the color conversion sheet 10, white light is emitted from the color conversion sheet 10, and the image display device 20 is illuminated from the back. Furthermore, the light incident on the image display device 20 is modulated on the basis of the image data and the image is displayed.

Figure 9:
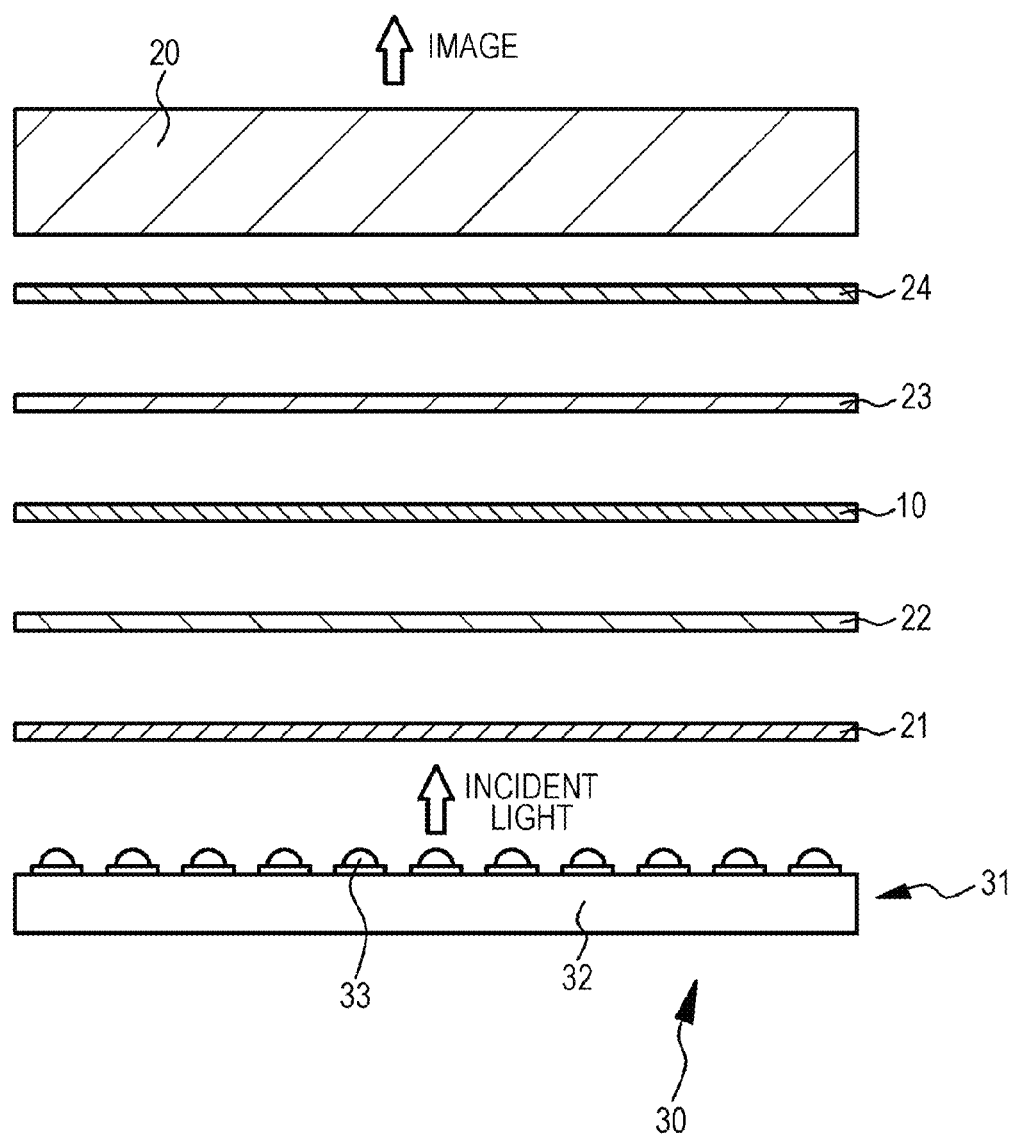
FIG. 9 is a conceptual diagram of another modified example of the image display device assembly in Example 3.

The color conversion sheet 10 may be disposed between the diffusion plate 21 and the diffusion film 22 (refer to FIG. 8), or be disposed between the diffusion film 22 and the lens film 23 (refer to FIG. 9). Likewise, the color conversion sheet 10 may be disposed at any position between the light source 31 and the reflection type polarization film 24 and is not limited to be disposed just above the light source 31. However, it is preferable that the color conversion sheet 10 is disposed just above the light source 31 as shown in FIG. 7 or is disposed between the diffusion plate 21 and the diffusion film 22 as shown in FIG. 8 in order to minimize the viewing angle dependence of the chromaticity of the light emitted from the color conversion sheet 10. On the other hand, it is preferable that the arrangement configuration shown in FIG. 8 is employed or the color conversion sheet 10 is disposed between the diffusion film 22 and the lens film 23 as shown in FIG. 9 in order to minimize the dependence of the chromaticity of the emitted light on the angle of radiation from the light source 31. Consequently, the arrangement configuration shown in FIG. 8 is most preferable because both the viewing angle dependence of the chromaticity of the emitted light and the dependence of the chromaticity on the angle of radiation from the light source are minimized.

A transparent base material in which green-emitting phosphor particles and red-emitting particles are dispersed in the inside may be used in place of the color conversion sheet 10. Such a transparent base material may be formed by an extrusion molding method or a calendering method in related art. The same goes for Example 4 described later.

Figure 10:
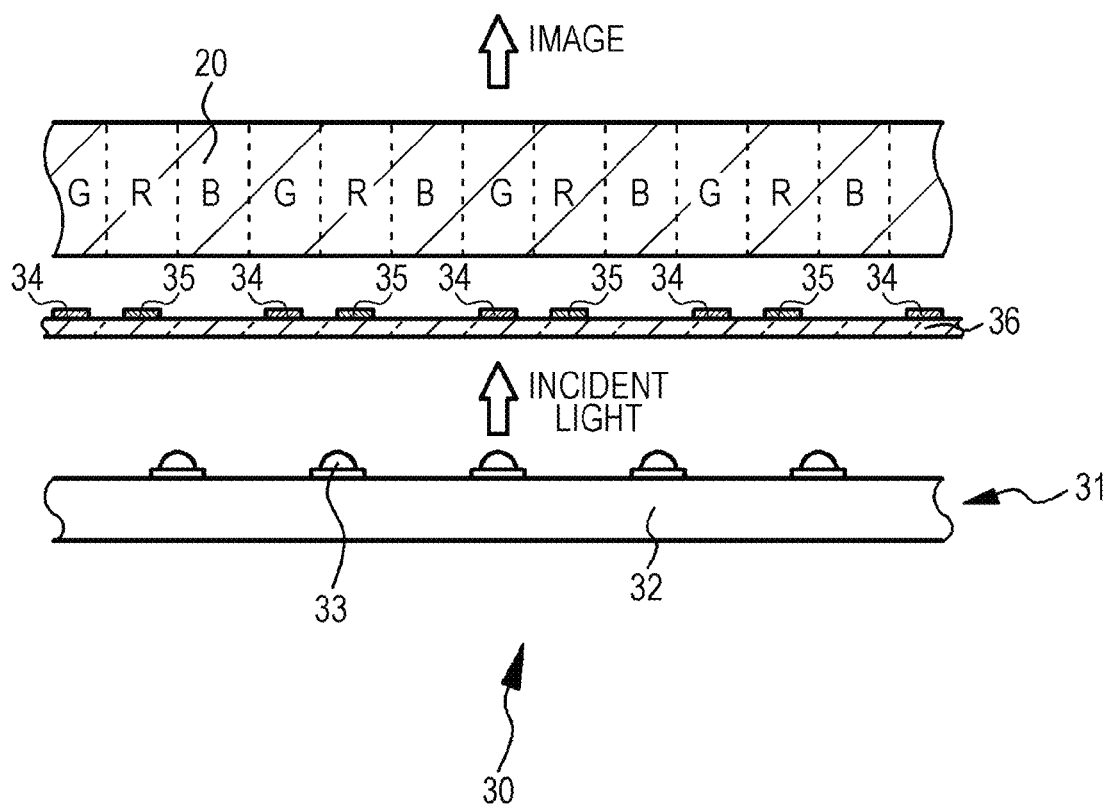
FIG. 10 is a conceptual diagram of another modified example of the image display device assembly in Example 3.

Alternatively, a transparent base material 36 provided with a green-emitting phosphor particle forming region 34 and a red-emitting particle forming region 35 may be disposed between the light source 31 and the image display device 20 in place of the color conversion sheet 10 (refer to FIG. 10). The green-emitting phosphor particle forming region 34 is disposed on the transparent base material 36 in such a way as to be located between the green-emitting subpixel (subpixel G) and the light source 31 in the image display device 20. The red-emitting particle forming region 35 is disposed on the transparent base material 36 in such a way as to be located between the red-emitting subpixel (subpixel R) and the light source 31 in the image display device 20. The green-emitting phosphor particles and the red-emitting particles are not disposed between the blue-emitting subpixel (subpixel B) and the light source 31 in the image display device 20. Alternatively, such a transparent base material 36 may be laminated on the image display device, or be incorporated into the image display device. Alternatively, the green-emitting phosphor particle forming region 34 may be disposed in the image display device 20 in such a way as to be located between the green-emitting subpixel (subpixel G) and the light source 31 in the image display device 20, and the red-emitting particle forming region 35 may be disposed in the image display device 20 in such a way as to be located between the red-emitting subpixel (subpixel R) and the light source 31 in the image display device 20.

Example 4

Figure 11A:
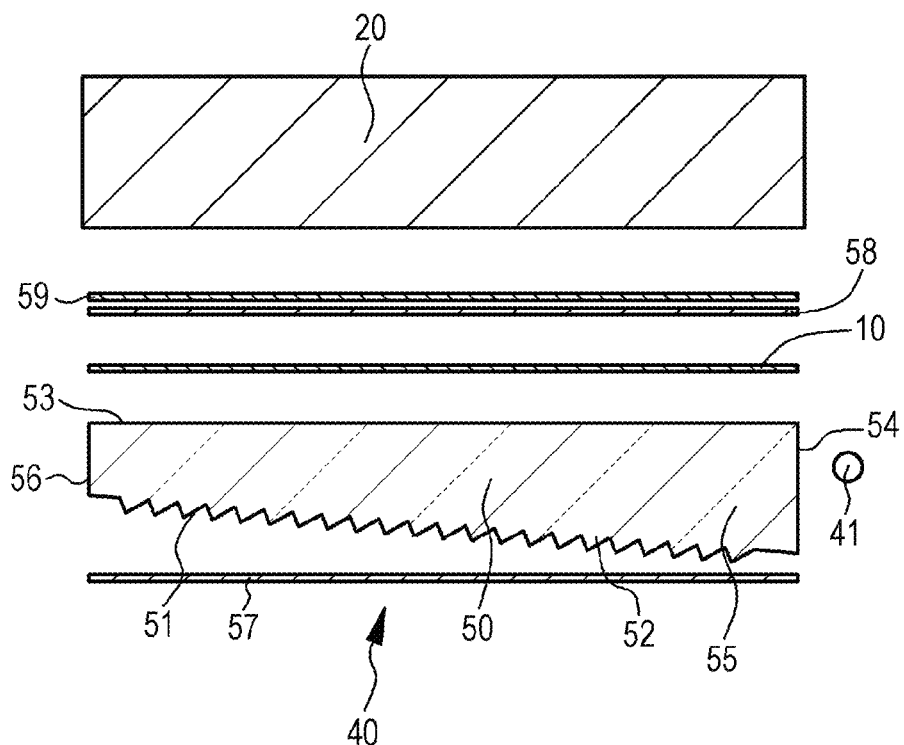
FIGS. 11A and 11B are conceptual diagrams of an edge-light type light-emitting device (planar light-emitting device) and a modified example thereof suitable for the use in an image display device assembly in Example 4.

Example 4 is a modified example of Example 3. In Example 3, the display device 30 is specified to be the direct-lighting type planar light-emitting device. Meanwhile, in Example 4, the light-emitting device is specified to be an edge light type (side light type) planar light-emitting device. As shown in FIG. 11A, in Example 4, a light-emitting device 40 includes the color conversion sheet 10 explained in Example 2, a light source 41, and a light guide plate 50.

The light guide plate 50 formed from a polycarbonate resin has a first surface (bottom surface) 51, a second surface (top surface) 53 opposite to the first surface 51, a first side surface 54, a second side surface 55, a third side surface 56 opposite to the first side surface 54, and a fourth side surface opposite to the second side surface 55. More specific shape of the light guide plate is a cuneiform truncated quadrangular pyramid as a whole. Two side surfaces opposite to each other of the truncated quadrangular pyramid correspond to the first surface 51 and the second surface 53 and the bottom surface of the truncated quadrangular pyramid corresponds to the first side surface 54. An uneven portion 52 is disposed on the surface portion of the first surface 51. The cross-sectional shape of a continuous convex and concave portions, where the light guide plate 50 is cut along a virtual plane which is in the direction of the light incident on the light guide plate 50 and which is perpendicular to the first surface 51, is a triangle. That is, the uneven portion 52 disposed on the surface portion of the first surface 51 is in the shape of a prism. The second surface 53 of the light guide plate 50 may be smooth (that is, may be a mirror finished surface) or be provided with blast grain having a diffusing effect (that is, may be a fine uneven surface). A reflection member 57 is disposed opposing to the first surface 51 of the light guide plate 50. Furthermore, the image display device 20 formed from a color liquid crystal display device is disposed opposing to the second surface 53 of the light guide plate 50. Moreover, the color conversion sheet 10, a diffusion sheet 58, and a prism sheet 59 are disposed between the image display device 20 and the second surface 53 of the light guide plate 50. The light emitted from the light source 41 is incident on the light guide plate 50 from the first side surface 54 (for example, a surface corresponding to the bottom surface of the truncated quadrangle pyramid) of the light guide plate 50, is scattered through collision with the uneven portion 52 on the first surface 51, is emitted from the first surface 51, is reflected by the reflection member 57, is entered again into the first surface 51, is emitted from the second surface 53, is passed through the color conversion sheet 10, the diffusion sheet 58, and the prism sheet 59, and is applied to the image display device 20.

Figure 11B:
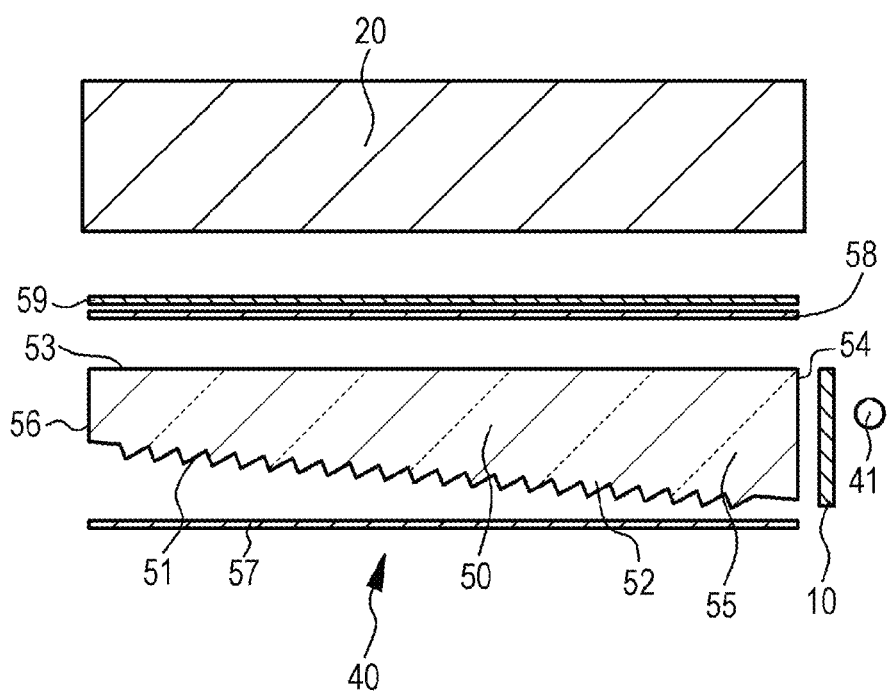
Figure 12:
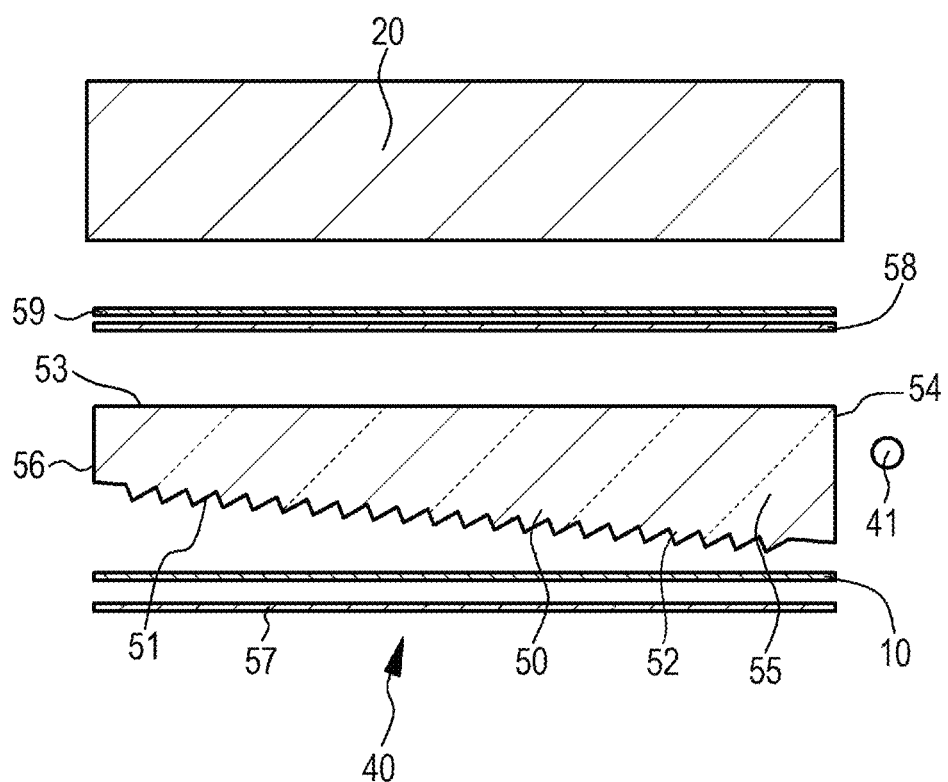
FIG. 12 is a conceptual diagram of another modified example of the edge-light type light-emitting device (planar light-emitting device) suitable for the use in the image display device assembly in Example 4.

Alternatively, as shown in FIG. 11B, the color conversion sheet 10 may be disposed between the light source 41 and the light guide plate 50, or as shown in FIG. 12, the color conversion sheet 10 may be disposed between the first surface 51 of the light guide plate 50 and the reflection member 57. Alternatively, a light guide plate, in which green-emitting phosphor particles and red-emitting particles are dispersed in the inside, may be used.

Example 5

Example 5 is also a modified example of Example 3. As is indicated by a schematic sectional view shown in FIG. 13A, in Example 5 as well, a light-emitting device 60 includes (a) a light source and (b) phosphor particles which are excited by the light emitted from the light source. In Example 5, the light source and the phosphor particles are assembled integrally, and is formed from a semiconductor light-emitting element assembly.

Specifically, a semiconductor light-emitting element (blue-emitting diode) 61 serving as a light source is fixed to the submount 71 and is electrically connected to an external electrode 73B through a gold wiring 73A, although not shown in the drawing, disposed on the submount 71. The external electrode 73B is electrically connected to a drive circuit (not shown in the drawing). The submount 71 is attached to a reflector cup 74, and the reflector cup 74 is attached to a heat sink 75. Furthermore, a plastic lens 72, which is formed from, for example, a silicone resin and which is a cap-shaped member, is disposed above the semiconductor light-emitting element 61. A light-transmission medium layer (not shown in the drawing) exemplified by an epoxy resin (refractive index: for example 1.5), a gel-like material (for example, trade name OCK-451 (refractive index: 1.51) of Nye Lubricants), silicone rubber, and an oil compound material, such as, silicone oil compound (for example, trade name TSK5353 (refractive index: 1.45) of Toshiba Silicone Co., Ltd.), which are transparent to the light emitted from the semiconductor light-emitting element 61, is filled in between the plastic lens 72 and the semiconductor light-emitting element 61. Moreover, layered phosphor particles (phosphor particle layer 62) composed of the green-emitting phosphor particles and the red-emitting particles explained in Example 1 are applied and formed on the inside surface of the plastic lens 72.

Figure 13A:
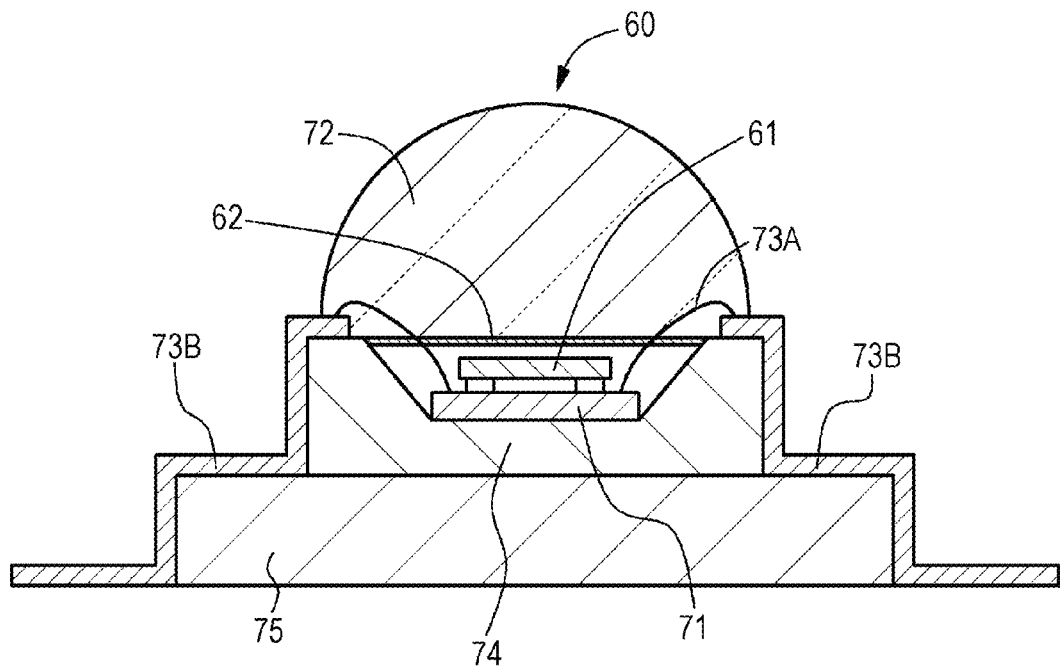
FIG. 13A is a schematic sectional view of a light-emitting device suitable for the use in an image display device assembly in Example 5.
Figure 13B:
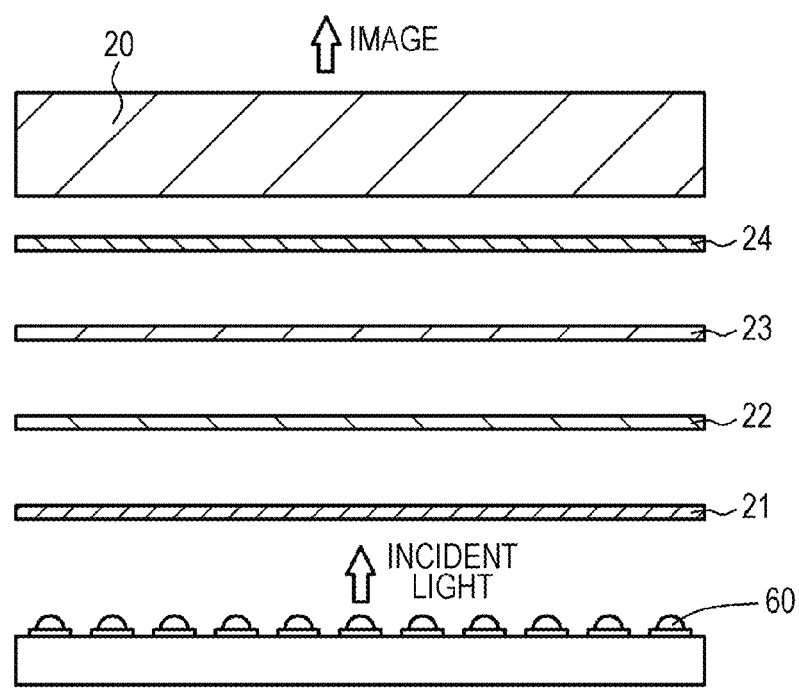
FIG. 13B is a conceptual diagram of the image display device assembly in Example 5.

FIG. 13B shows a conceptual diagram of the image display device assembly in Example 5. The blue-emitting diode assembly 33 explained in Example 3 is replaced with the light-emitting device 60 in Example 5, and disposition of the color conversion sheet 10 is omitted. The white light emitted from the light-emitting device 60 illuminates the image display device 20 from the back.

The phosphor particles may be brought into the state of being dispersed in the inside of the plastic lens 72 instead of disposition of the phosphor particle layer 62 on the inside surface of the plastic lens 72. Alternatively, a sheet-shaped material in which the green-emitting phosphor particles and the red-emitting particles are dispersed may be used instead of application and formation of the phosphor particle layer 62 composed of the green-emitting phosphor particles and the red-emitting particles on the inside surface of the plastic lens 72.

Up to this point, the present invention has been explained with reference to the preferred examples, although the present invention is not limited to these examples. Various production conditions and raw materials used in the method for manufacturing green-emitting phosphor particles, the configuration, the structure, and the constituent materials of the color conversion sheet, the configurations, the structures, and the constituent materials of the light-emitting device and the image display device assembly, and the like explained in the examples are no more than exemplifications and can be changed appropriately. As for the light source, a semiconductor laser (LD) may be used instead of the light-emitting diode.

In some cases, an energy line emitted from the light source may be ultraviolet rays instead of the blue light. In this case, blue-emitting phosphor particles (for example, $BaMgAl_{10}O_{17}$:Eu, $BaMg_2Al_{16}O_{27}$:Eu, $Sr_2P_2O_7$:Eu, $Sr_5(PO_4)_2Cl$:Eu, $(Sr,Ca,Ba,Mg)_5(PO_4)_2Cl$:Eu, $CaWO_4$, or $CaWO_4$:Pb), which are excited through ultraviolet irradiation, are used in combination.

Examples of fields of application of the light-emitting device include not only the above-described light-emitting devices, image display devices, planar light-emitting devices (planar light sources), and liquid crystal display device assemblies including color liquid crystal display devices, but also lamp fittings and lamps in transport devices, e.g., automobiles, electric cars, ships, and aircraft (for example, headlights, taillights, high mount stop lights, small lights, turn signal lamps, fog lights, body interior lights, meter panel lights, light sources incorporated in various buttons, destination sign lamps, emergency lamps, and emergency exit lighting), various lamp fittings and lamps in buildings (outdoor lamps, room lamps, lighting fixtures, emergency lamps, emergency exit lighting, and the like), street lights, signals and advertising signs, various indicating light fittings in machines, apparatuses, and the like, lighting fixtures and natural illumination portions in tunnels, underground passageways, and the like, special illumination in various inspection apparatuses, e.g., biological microscopes, pasteurizers by using light, deodorization pasteurizers in combination with photocatalysts, exposing apparatuses in photography and semiconductor lithography, and apparatuses to modulate light and transmit information through spaces, optical fibers, or waveguides.

The present application contains subject matter related to that disclosed in Japanese Priority Patent Application JP 2010-108220 filed in the Japan Patent Office on May 10, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing green-emitting phosphor particles comprising the steps of:
    producing a $(Sr,Eu)SO_3$ powder containing europium and strontium from a solution containing a europium compound, a strontium compound, and a sulfur compound;
    mixing the resulting powder and a powdered gallium compound; and
    performing firing,
    wherein the green-emitting phosphor articles comprise $Sr_{1-x}Ga_2S_4$:$Eu_x$ (where $0.10 \leq x \leq 0.20$) and
    the value of (internal quantum efficiency/absorption efficiency) is 0.7 or more.

2. The method for manufacturing green-emitting phosphor particles according to claim 1,
    wherein the $(Sr,Eu)SO_3$ powder is produced by dropping a sulfite into the solution containing a europium compound and a strontium compound.

3. The method for manufacturing green-emitting phosphor particles according to claim 1,
    wherein the mixing of the powder and the powdered gallium compound is performed by using a ball mill.

4. A method for manufacturing green-emitting phosphor particles comprising the steps of:
    producing a $(Sr,Eu)SO_3$ powder by
        adding a powdered gallium compound to a solution containing a europium compound, a strontium compound, and a sulfur compound, and
        adding a salt to precipitate the europium compound and the strontium compound; and
    firing the resulting powder,
    wherein the green-emitting phosphor particles comprise $Sr_{1-x}Ga_2S_4$:$Eu_x$ (where $0.10 \leq x \leq 0.20$) and
    the value of (internal quantum efficiency/absorption efficiency) is 0.7 or more.

5. The method for manufacturing green-emitting phosphor particles according to claim 4,
    wherein the $(Sr,Eu)SO_3$ powder is produced by
        adding the powdered gallium compound to the solution containing a europium compound and a strontium compound and
        dropping a sulfite.

6. The method for manufacturing green-emitting phosphor particles according to claim 1,
    wherein the firing is performed in a hydrogen sulfide gas atmosphere.

7. The method for manufacturing green-emitting phosphor particles according to claim 2,
    wherein the mixing of the powder and the powdered gallium compound is performed by using a ball mill.

8. The method for manufacturing green-emitting phosphor particles according to claim 4,
    wherein the firing is performed in a hydrogen sulfide gas atmosphere.

* * * * *